(12) United States Patent
Kurita et al.

(10) Patent No.: US 11,623,376 B2
(45) Date of Patent: Apr. 11, 2023

(54) CONDUCTIVE MEMBER MODULE, AND METHOD OF MANUFACTURING THE SAME

(71) Applicant: DENSO CORPORATION, Kariya (JP)

(72) Inventors: Akifumi Kurita, Kariya (JP); Yohei Yoshimura, Kariya (JP); Ryota Tanabe, Kariya (JP); Tsuyoshi Arai, Kariya (JP)

(73) Assignee: DENSO CORPORATION, Kariya (JP)

( * ) Notice: Subject to any disclaimer, the term of this patent is extended or adjusted under 35 U.S.C. 154(b) by 421 days.

(21) Appl. No.: 16/866,431

(22) Filed: May 4, 2020

(65) Prior Publication Data

US 2020/0262115 A1 Aug. 20, 2020

Related U.S. Application Data

(63) Continuation of application No. PCT/JP2018/040939, filed on Nov. 5, 2018.

(30) Foreign Application Priority Data

Nov. 6, 2017 (JP) .............................. JP2017-214115

(51) Int. Cl.
*B29C 45/14* (2006.01)
*H01B 1/20* (2006.01)
*H01R 13/52* (2006.01)
*H02G 5/06* (2006.01)
*B29L 31/34* (2006.01)
*H01L 25/16* (2023.01)
*H02M 7/5387* (2007.01)

(52) U.S. Cl.
CPC .. *B29C 45/14467* (2013.01); *B29C 45/14639* (2013.01); *H01B 1/20* (2013.01); *H01R 13/52* (2013.01); *H02G 5/06* (2013.01); *B29L 2031/34* (2013.01); *H01L 25/16* (2013.01); *H02M 7/53871* (2013.01)

(58) Field of Classification Search
CPC ...................................................... H01R 43/24
See application file for complete search history.

(56) References Cited

U.S. PATENT DOCUMENTS

| 5,514,913 A * | 5/1996 | Mangiagli ......... B29C 45/14073 257/E23.044 |
| 8,540,917 B2 * | 9/2013 | Yamamoto .............. B32B 27/34 264/318 |
| 2011/0143111 A1 | 6/2011 | Yamamoto et al. |
| 2017/0018884 A1 * | 1/2017 | Hayase .................. H01R 43/24 |

FOREIGN PATENT DOCUMENTS

| JP | H07246621 A | 9/1995 |
| JP | 2011088406 A | 5/2011 |
| JP | 2011143711 A | 7/2011 |

* cited by examiner

*Primary Examiner* — Krystal Robinson
(74) *Attorney, Agent, or Firm* — Harness, Dickey & Pierce, P.L.C.

(57) ABSTRACT

Performed are an accommodation step of accommodating a pair of conductive members in a die, a sealing step of injecting a resin to seal the conductive members, and an extraction step of extracting a conductive member module. In the sealing step, the conductive members are sealed while a force is applied by the resin injected into the die to the individual conductive members in directions away from each other, and the individual conductive members are supported by support members disposed outside.

9 Claims, 34 Drawing Sheets

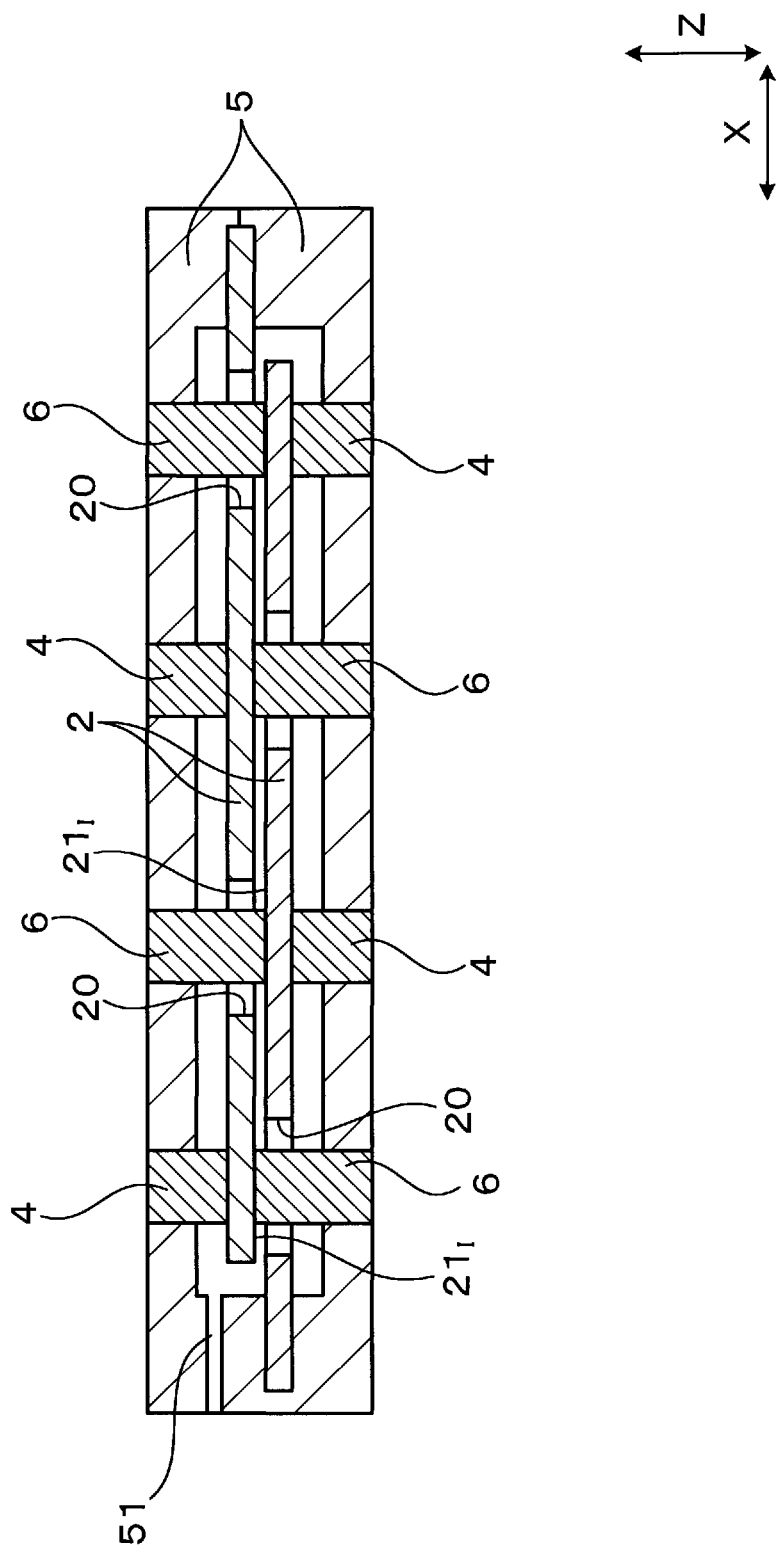

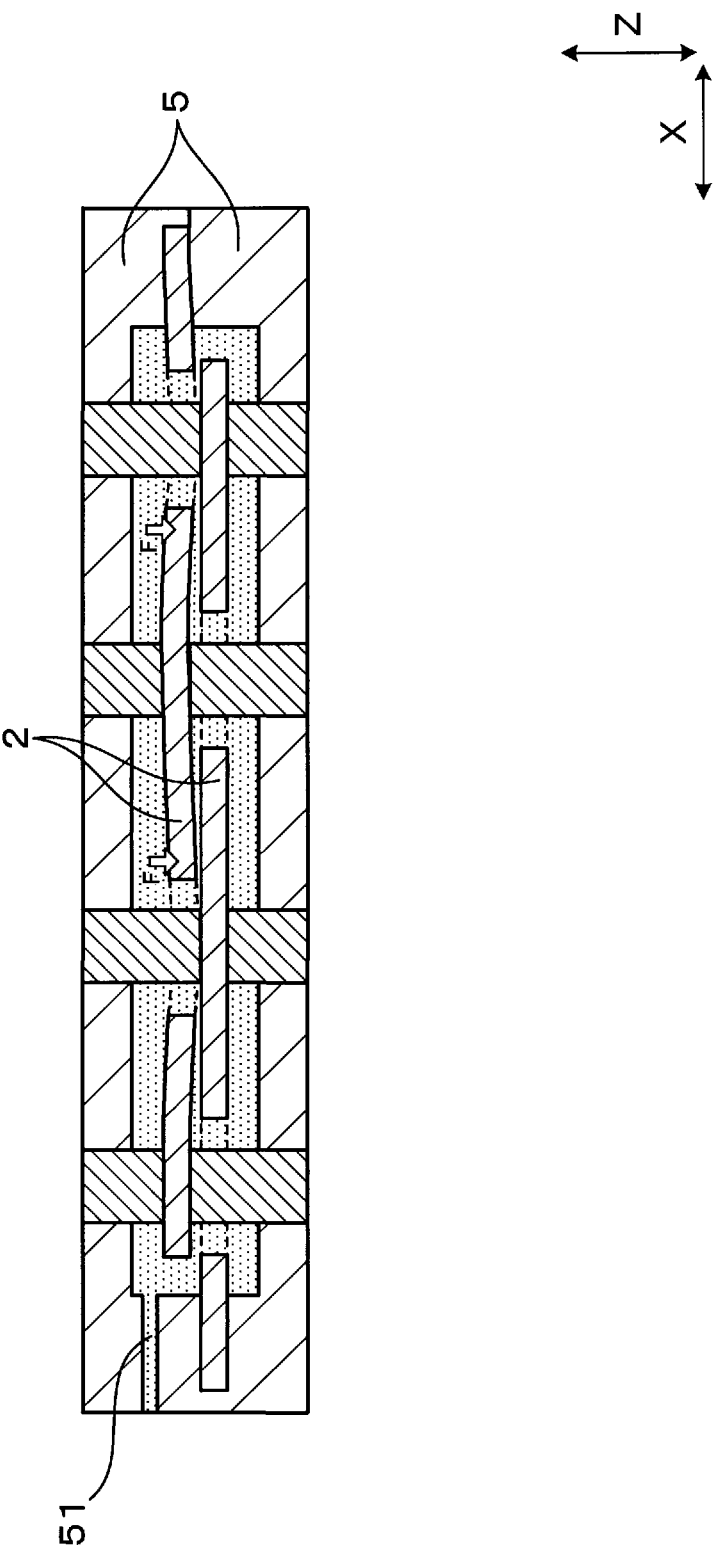

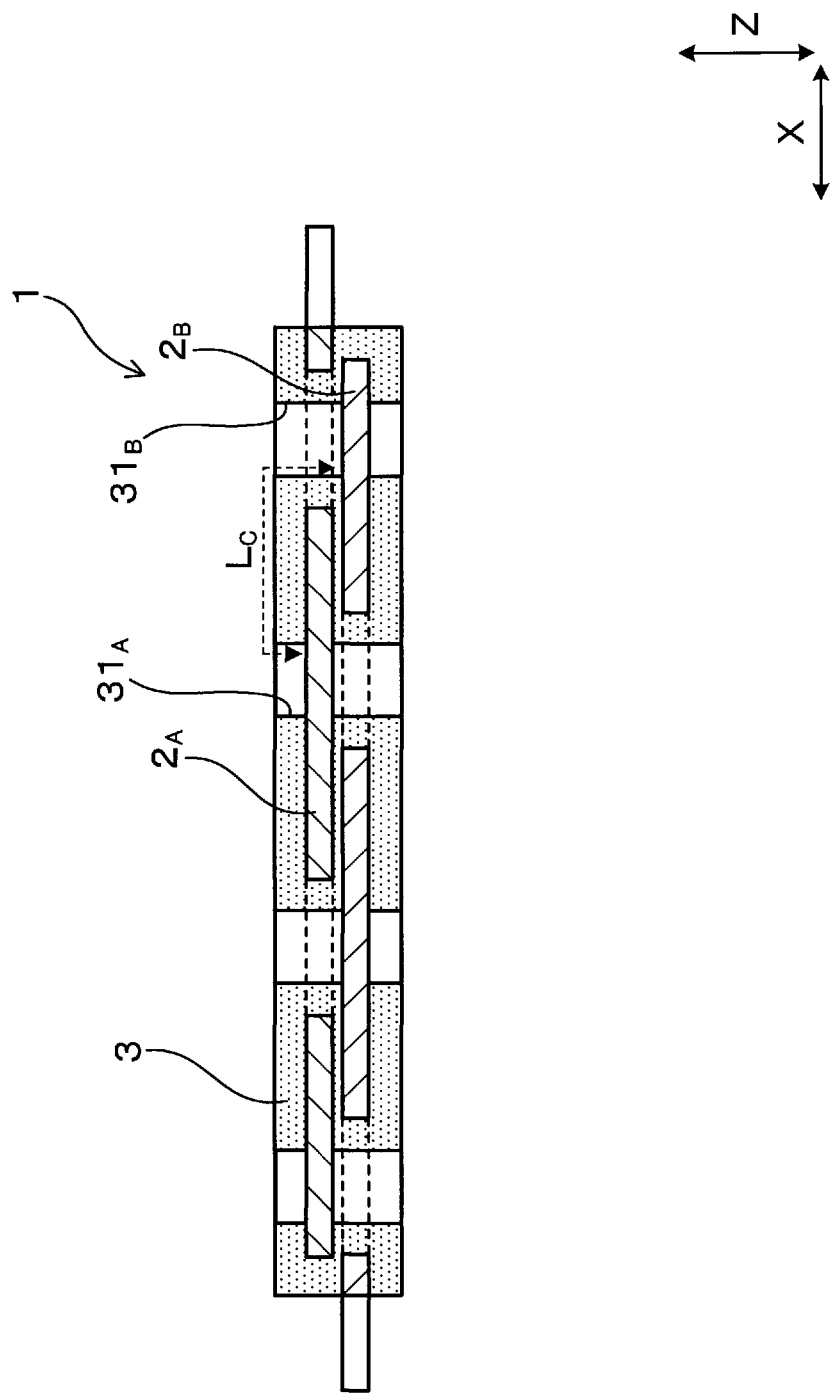

CONDUCTIVE MEMBER MODULE, AND METHOD OF MANUFACTURING THE SAME

CROSS-REFERENCE TO RELATED APPLICATION

This application is the U.S. bypass application of International Application No. PCT/JP2018/040939 filed Nov. 5, 2018 which designated the U.S. and claims priority to Japanese Patent Application No. 2017-214115, filed Nov. 6, 2017, the contents of both of which are incorporated herein by reference.

TECHNICAL FIELD

The present disclosure relates to a conductive member module having a pair of conductive members facing each other and a sealing part for sealing the pair of conductive members, and relates to a method of manufacturing the same.

BACKGROUND

A conductive member module having a pair of conductive members facing each other, and a sealing part for sealing the pair of conductive members is known as a component used in electrical devices etc. (see JP 5446722 B). In the manufacturing of such a conductive member module, a pair of conductive members are first accommodated in a molding die (accommodation step), and a resin is injected into the die to seal the pair of conductive members (sealing step). After the resin is solidified, the conductive member module is extracted from the die (extraction step).

SUMMARY

A first aspect of the present disclosure is a manufacturing method of a conductive member module having a pair of conductive members formed in a plate shape and facing each other, and a sealing part for sealing the pair of conductive members, the method includes steps of:

an accommodation step of accommodating the pair of conductive members in a molding die in a state of being separated from each other, a sealing step of injecting a fluid resin into the die to seal the pair of conductive members, and an extraction step of extracting the conductive member module from the die; wherein in the sealing step, the conductive members are sealed while the individual conductive members, to which a force is applied by the resin injected into the die in directions away from each other, are supported by support members externally.

Further, a second aspect of the present disclosure is a conductive member module includes:

a pair of conductive members formed in a plate shape and facing each other, a sealing part made of a resin and sealing the pair of conductive members, through holes formed in the individual conductive members and penetrating in the facing direction of the pair of conductive members, first recesses formed in a recessed shape in the sealing part and having bottoms in which outer surfaces of the conductive members in the facing direction are exposed, and second recesses formed so as to be recessed in the facing direction through the through holes from the outside to the inside of the pair of conductive members; wherein the resin constituting the sealing part is partially present between inner surfaces of the conductive members and bottom surfaces of the second recesses in the facing direction.

BRIEF DESCRIPTION OF THE DRAWINGS

The above features of the present disclosure will be made clearer by the following detailed description, given referring to the appended drawings. In the accompanying drawings:

FIG. 32 is an explanatory view of a manufacturing method of a conductive member module in a comparative embodiment;

FIG. 33 is an explanatory view of the manufacturing method following FIG. 32; and FIG. 34 is a sectional view of the conductive member module in the comparative embodiment.

DETAILED DESCRIPTION OF THE PREFERRED EMBODIMENTS

Figure 1:
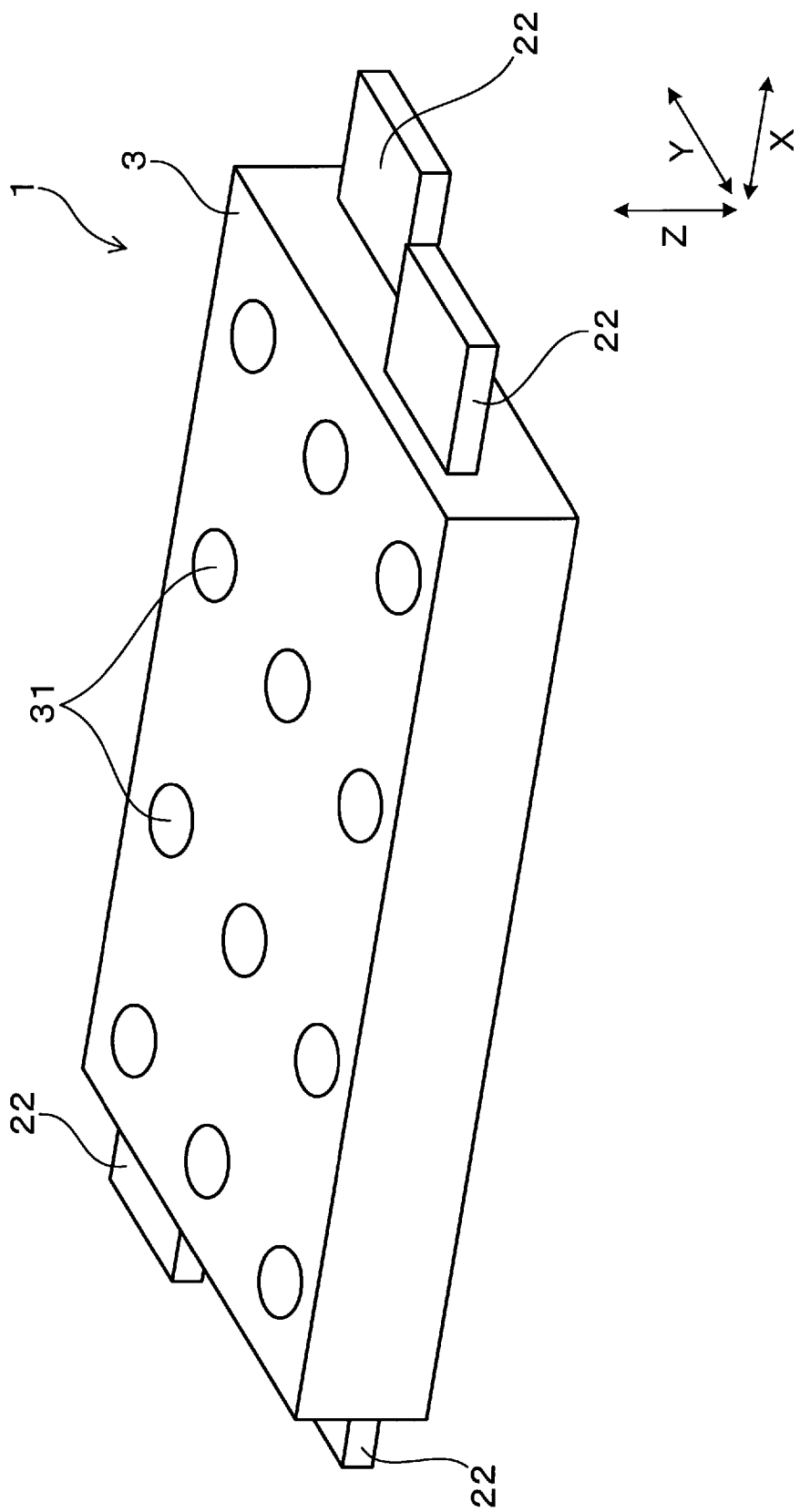
FIG. 1 is a perspective view of a conductive member module in a first embodiment.

In the above-mentioned conductive member module, the distance between the pair of conductive members is narrowed in order to reduce the parasitic inductance between the pair of conductive members.

In the above-mentioned manufacturing method of a conductive member module, in the sealing step, a pair of conductive members may receive a force from the resin in directions to approach each other. Therefore, the conductive members may come into contact with each other and short-circuit. In particular, when the sealing step is performed in a state in which the distance between the pair of conductive members is narrowed in order to reduce the inductance, the pair of conductive members may come into contact with each other just when they slightly approach each other.

An object of the present disclosure is to provide a conductive member module that can reduce the inductance between a pair of conductive members and that can sufficiently enhance the insulation properties between the pair of conductive members, and to also provide a method of manufacturing the same.

A first aspect of the present disclosure is a manufacturing method of a conductive member module having a pair of conductive members formed in a plate shape and facing each other, and a sealing part for sealing the pair of conductive members.

The method includes steps of an accommodation step of accommodating the pair of conductive members in a molding die in a state of being separated from each other, a sealing step of injecting a fluid resin into the die to seal the pair of conductive members, and an extraction step of extracting the conductive member module from the die.

In the sealing step, the conductive members are sealed while the individual conductive members, to which a force is applied by the resin injected into the die in directions away from each other, are supported by support members externally.

Further, a second aspect of the present disclosure is a conductive member module including a pair of conductive members formed in a plate shape and facing each other, a sealing part made of a resin and sealing the pair of conductive members, through holes formed in the individual conductive members and penetrating in the facing direction of the pair of conductive members, first recesses formed in a recessed shape in the sealing part and having bottoms in which outer surfaces of the conductive members in the facing direction are exposed, and second recesses formed so as to be recessed in the facing direction through the through holes from the outside to the inside of the pair of conductive members.

The resin constituting the sealing part is partially present between inner surfaces of the conductive members and bottom surfaces of the second recesses in the facing direction.

In the manufacturing method of a conductive member module, in the sealing step, the resin applies a force to the individual conductive members in directions away from each other. The conductive members are sealed while the individual conductive members, to which the force is applied, are supported by the support members externally.

Therefore, in the sealing step, the pair of conductive members are less likely to approach each other, and problems such as contact between the pair of conductive members can be avoided.

Further, in the above embodiment, the pair of conductive members are less likely to come into contact with each other, the sealing step can be performed in a state in which the distance between the pair of conductive members is narrowed. Therefore, the parasitic inductance between the pair of conductive members can be reduced.

Moreover, the conductive member module includes two types of recesses, i.e., a first recess and a second recess. In the manufacturing of the conductive member module, support members and the like that support the conductive members are placed in the die. Therefore, the recesses are formed in the positions in which the support members etc. are arranged.

In the conductive member module, the outer surfaces of the conductive members are exposed at the bottom of the first recesses, whereas the inner surfaces of the conductive members are not exposed at the bottom of the second recesses. Therefore, only the outer surfaces of the pair of conductive members are exposed (see FIG. 17), and the creepage distance between the conductive members can be increased. Accordingly, the insulation properties of the pair of conductive members can be enhanced.

As described above, these aspects make it possible to provide a conductive member module that can reduce the inductance between a pair of conductive members and that can sufficiently enhance the insulation properties between the pair of conductive members, and to also provide a method of manufacturing the same.

First Embodiment

Figure 2:
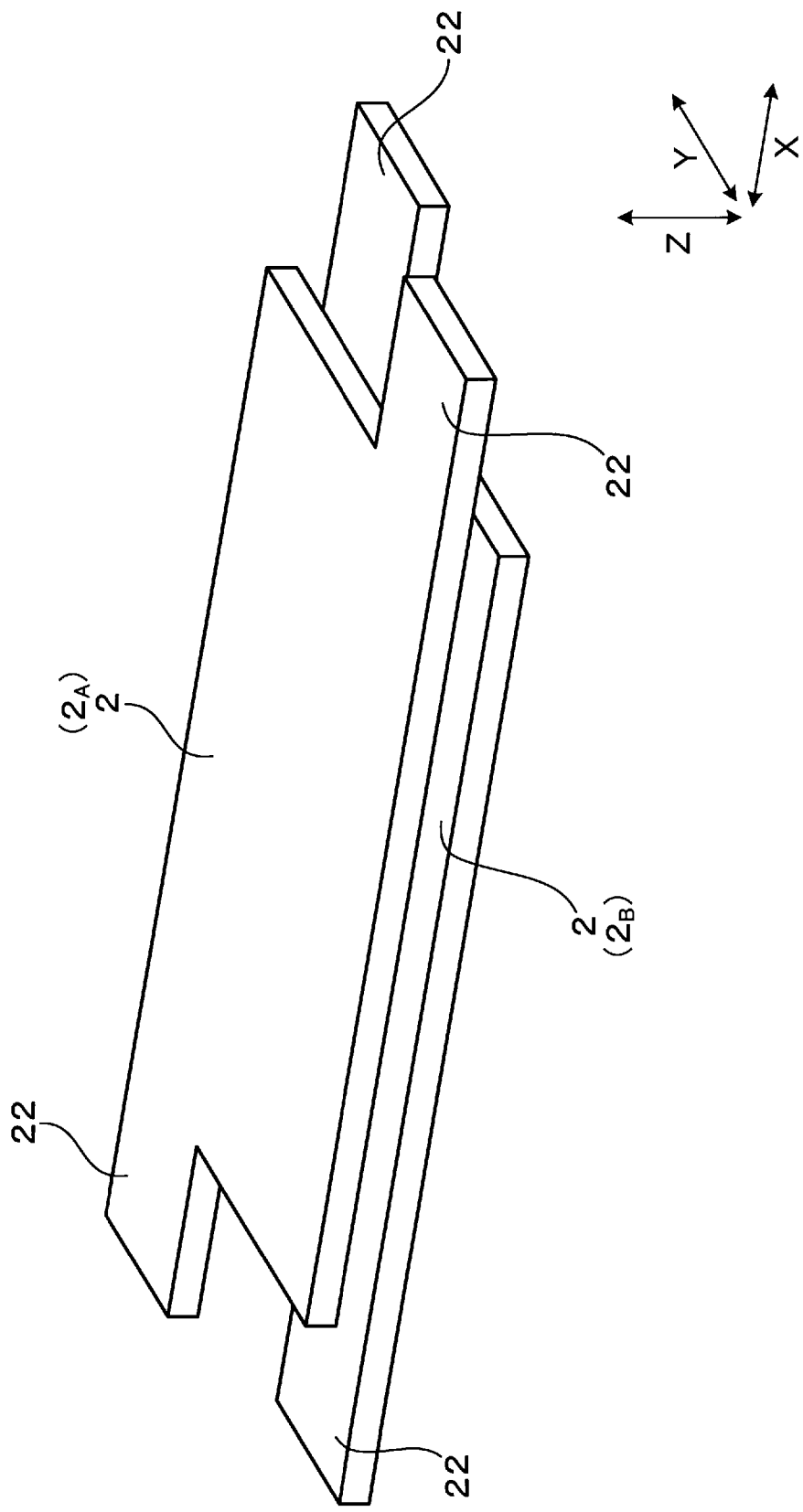
FIG. 2 is a perspective view of conductive members in the first embodiment.

An embodiment relating to the manufacturing method of a conductive member module is described with reference to FIGS. 1 to 11. As shown in FIGS. 1 and 2, the conductive member module 1 of the present embodiment has a pair of conductive members 2 formed in a plate shape and facing each other, and a sealing part 3 for sealing the pair of conductive members 2. In the present embodiment, the conductive member module 1 is manufactured by performing an accommodation step (see FIGS. 3 and 4), a sealing step (see FIGS. 5 and 6), and an extraction step (see FIGS. 7 and 8).

Figure 3:
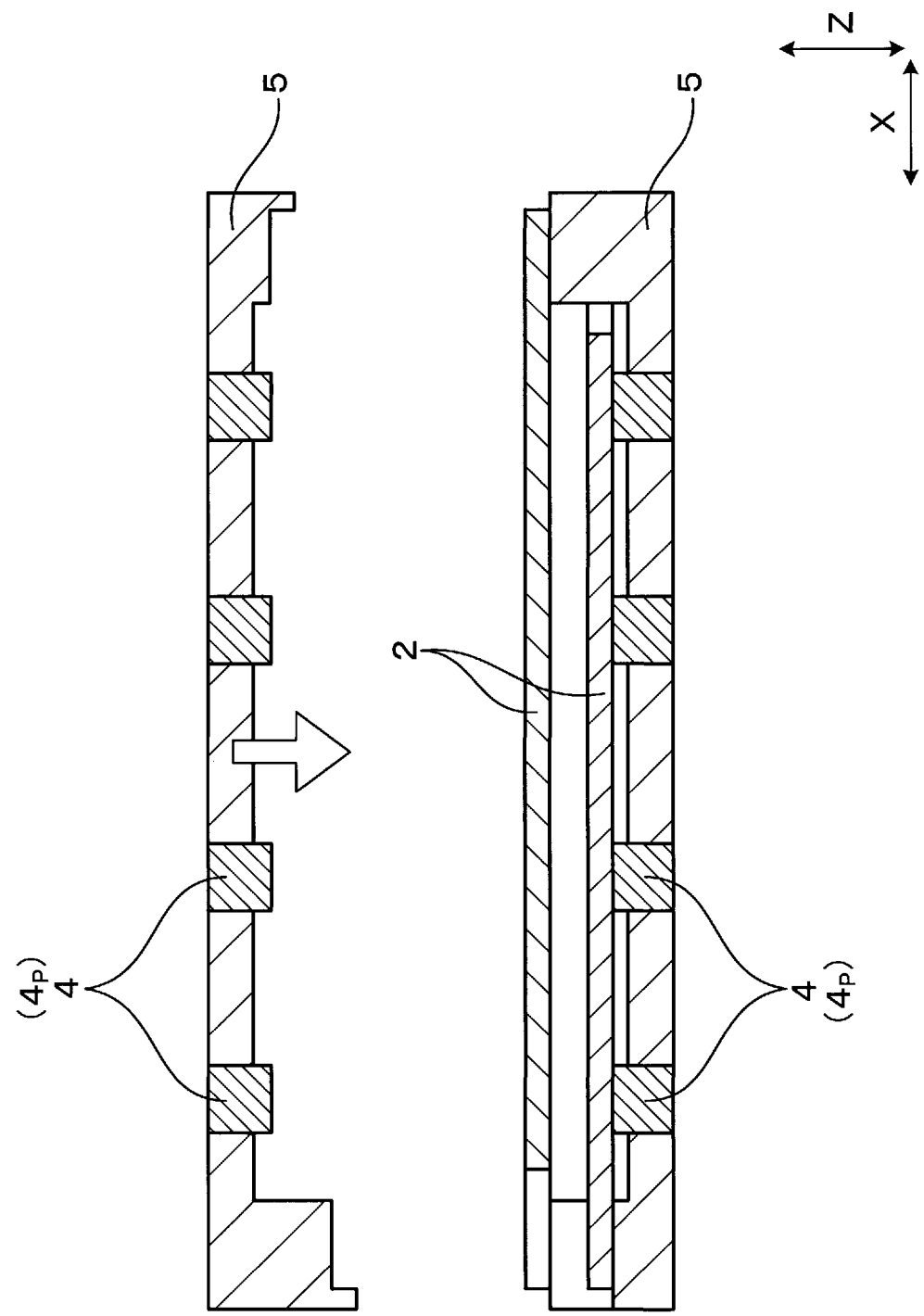
FIG. 3 is an explanatory view of a manufacturing method of the conductive member module in the first embodiment.
Figure 4:
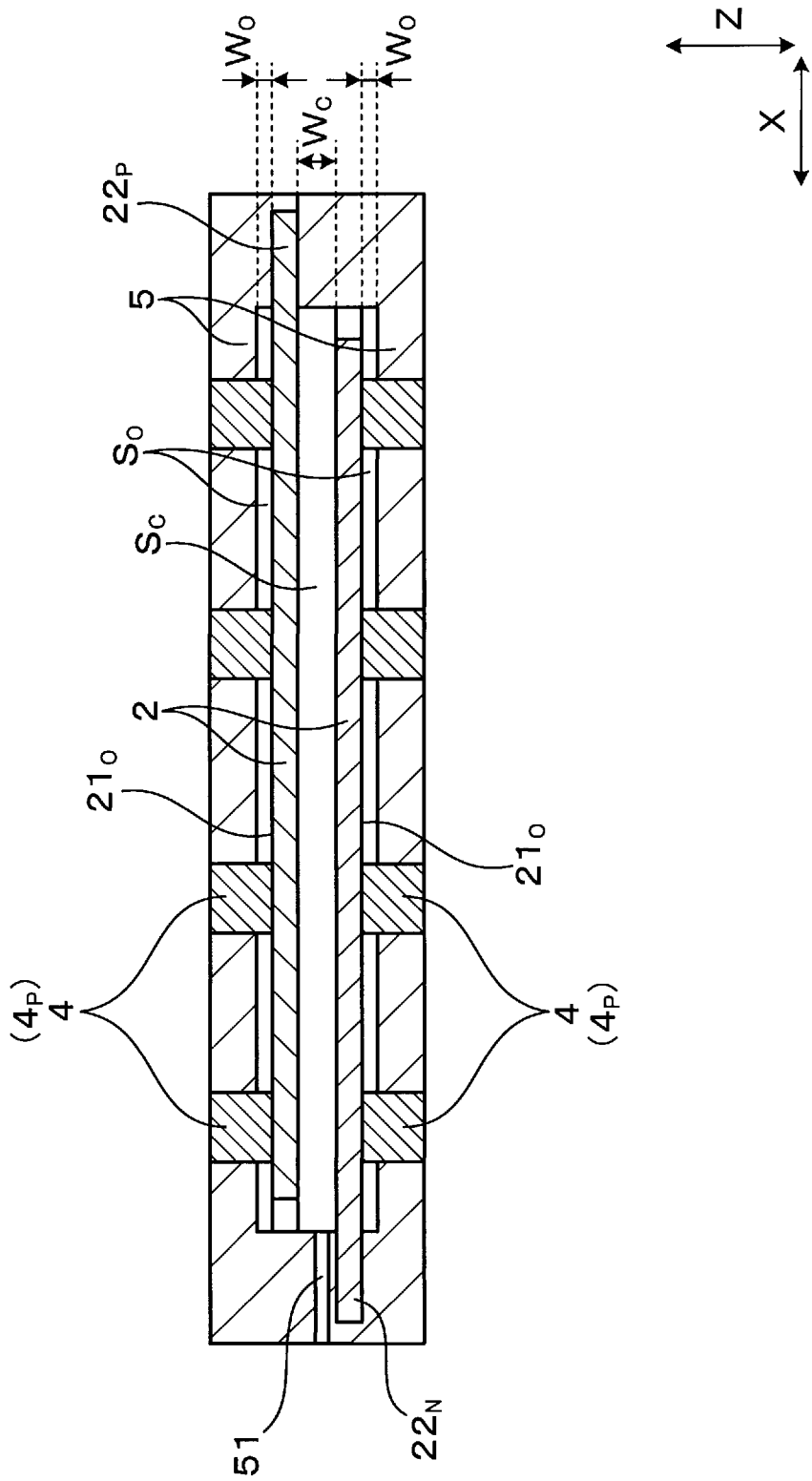
FIG. 4 is an explanatory view of the manufacturing method following FIG. 3.

As shown in FIGS. 3 and 4, in the accommodation step, the pair of conductive members 2 are accommodated in a molding die 5 in a state of being separated from each other.

Figure 5:
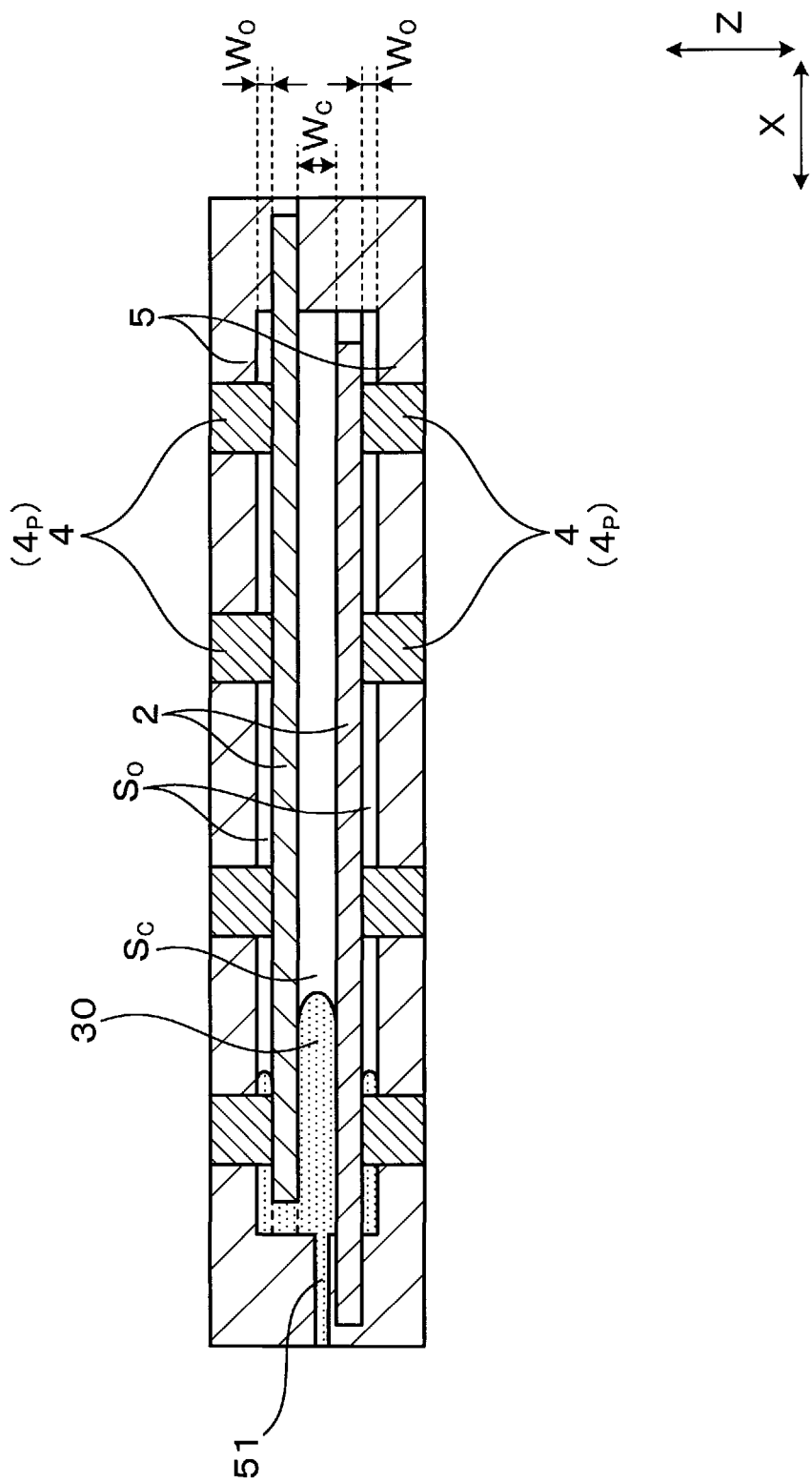
FIG. 5 is an explanatory view of the manufacturing method following FIG. 4.
Figure 6:
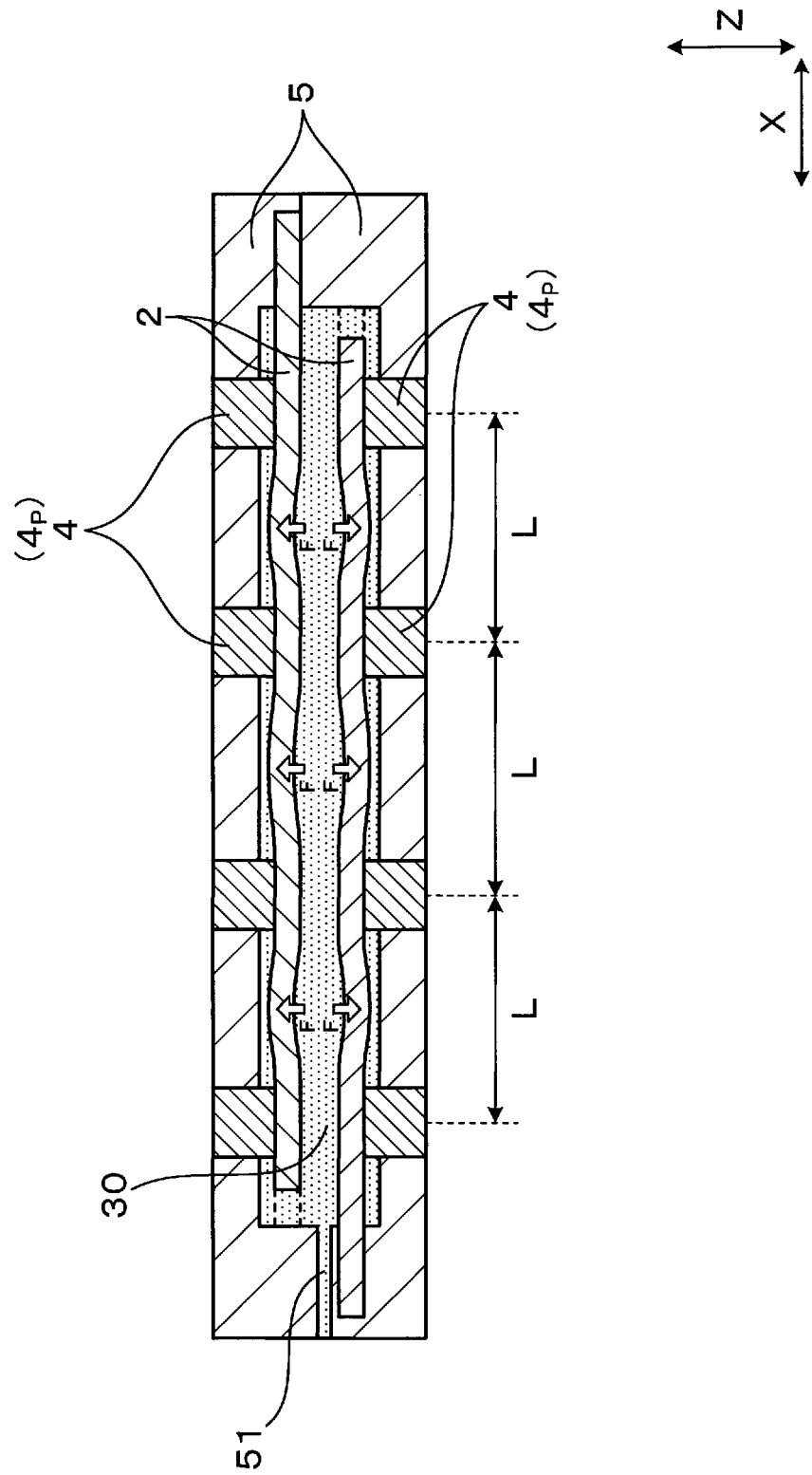
FIG. 6 is an explanatory view of the manufacturing method following FIG. 5.

Further, as shown in FIGS. 5 and 6, in the sealing step, a fluid resin 30 is injected into the die 5 to seal the pair of conductive members 2.

Figure 7:
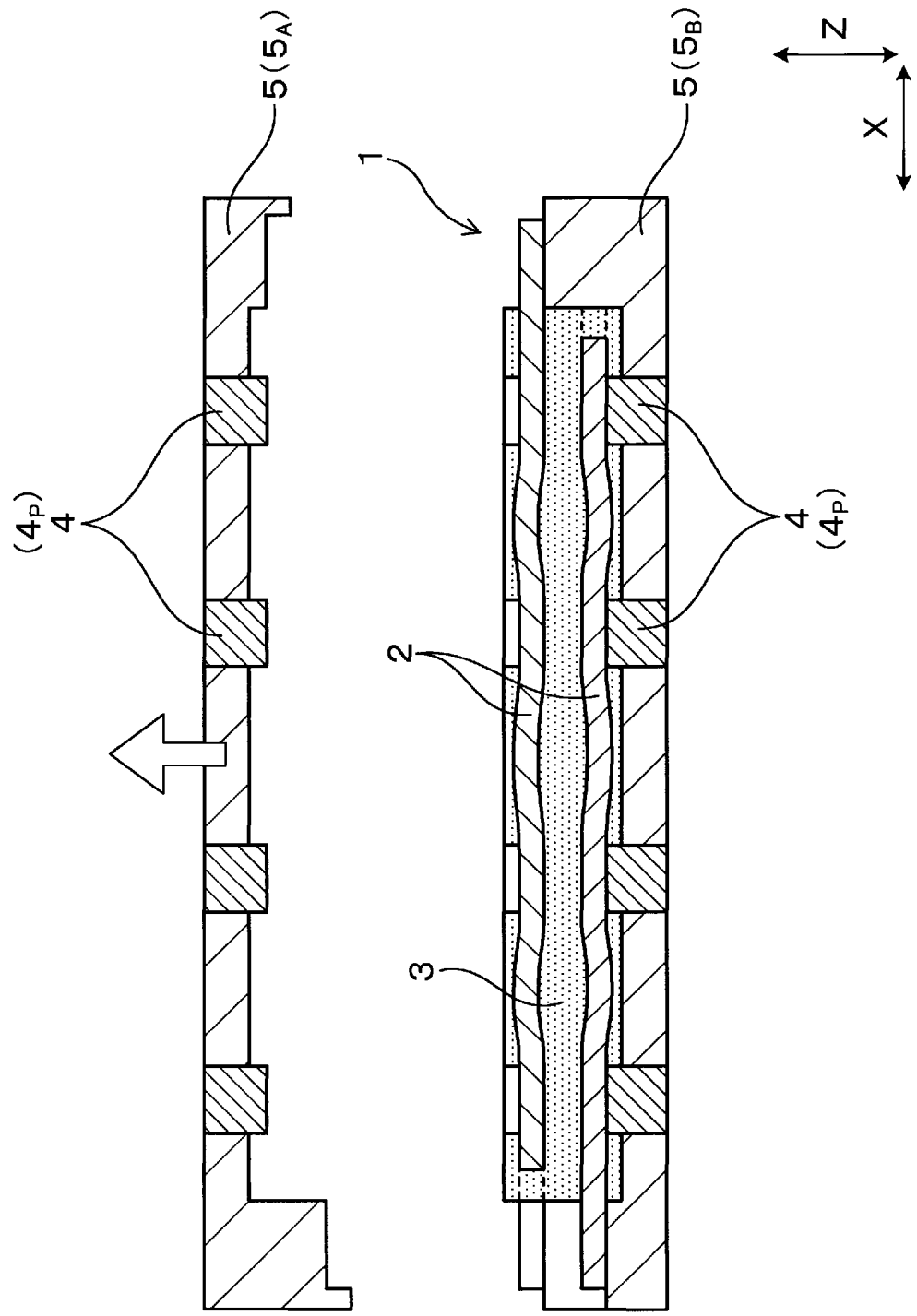
FIG. 7 is an explanatory view of the manufacturing method following FIG. 6.
Figure 8:
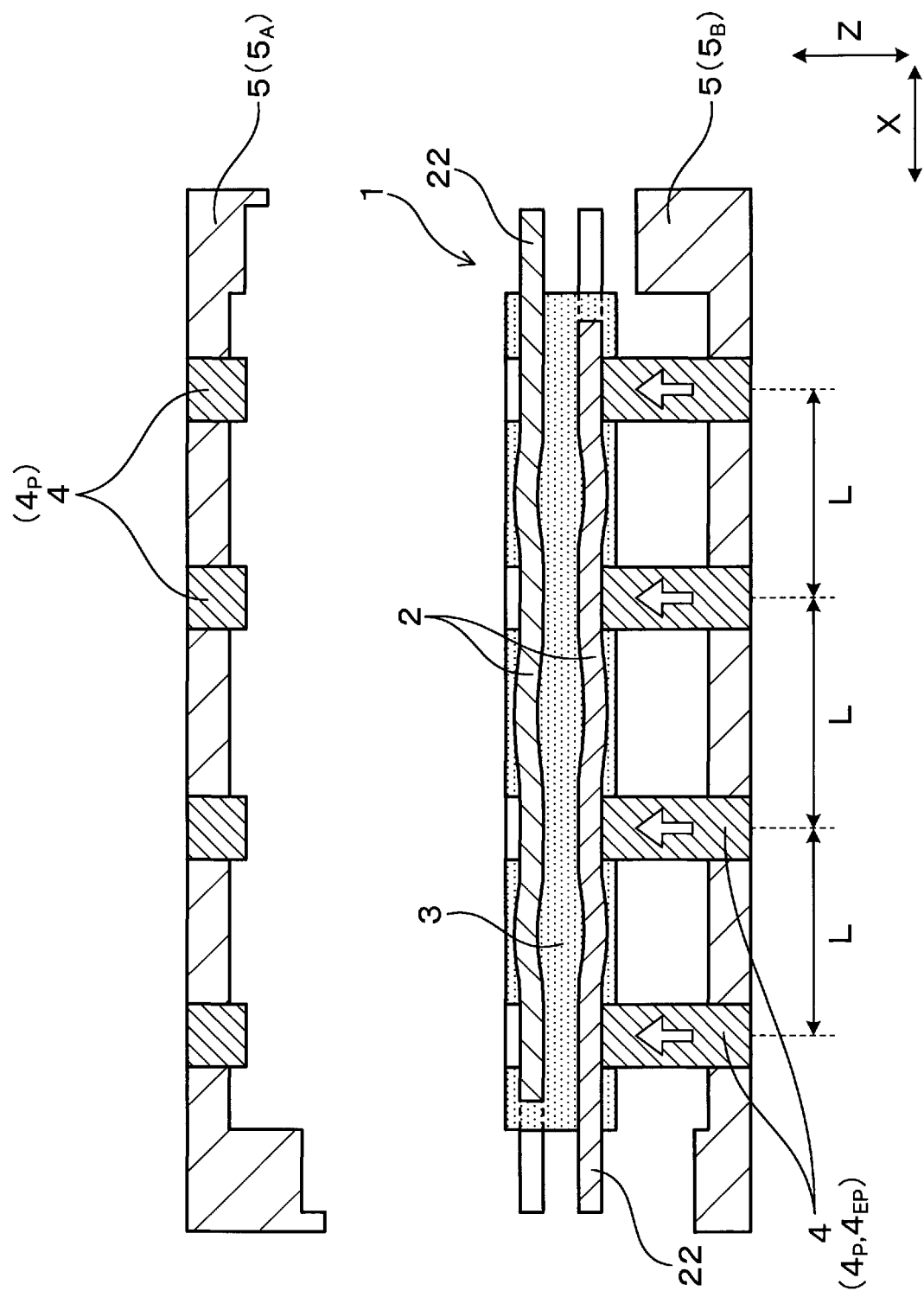
FIG. 8 is an explanatory view of the manufacturing method following FIG. 7.

As shown in FIGS. 7 and 8, in the extraction step, the conductive member module 1 is extracted from the die 5 after the resin 30 is solidified.

As shown in FIGS. 5 and 6, in the sealing step, the conductive members 2 are sealed while the individual conductive members 2, to which a force F is applied by the resin 30 injected into the die 5 in directions away from each other in a facing direction (Z direction) of the pair of conductive members 2, are supported by support members 4 externally in the Z direction.

Figure 10:
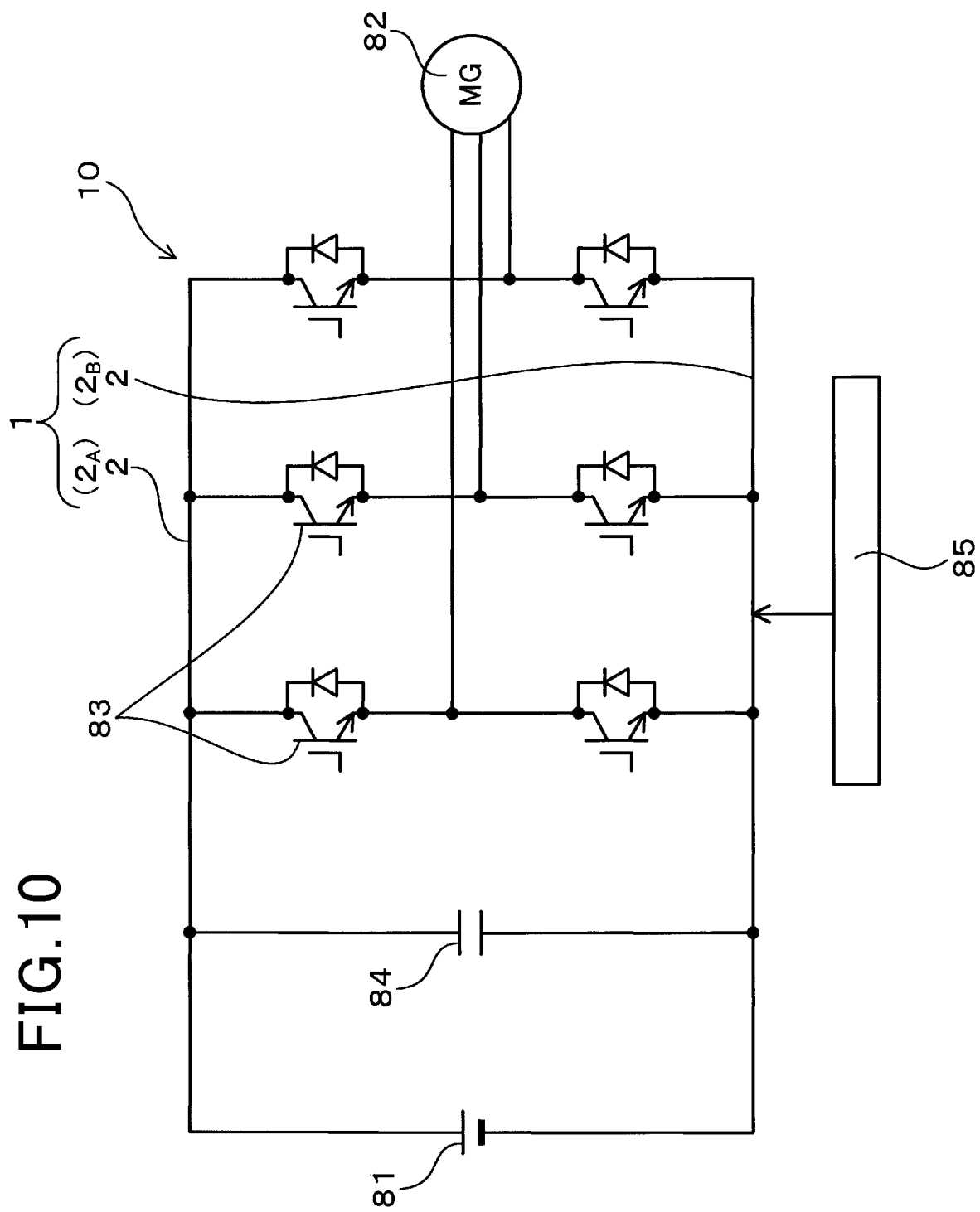
FIG. 10 is a circuit diagram of a power conversion device using the conductive member module in the first embodiment.

As shown in FIG. 10, in the present embodiment, the conductive member module 1 is used in a power conversion device 10. The power conversion device 10 includes a smoothing capacitor 84 and a plurality of switching elements 83. The capacitor 84 and the switching elements 83 are electrically connected using the conductive members 2 in the conductive member module 1. The power conversion device 10 uses a control unit 85 to turn on and off the switching elements 83. A DC power supplied from a DC power supply 81 is thereby converted into an AC power to drive a three-phase AC motor 82.

As shown in FIGS. 1 and 2, each conductive member 2 includes a connection terminal 22. These connection terminals 22 are electrically connected to the capacitor 84, the switching elements 83, and the like. The pair of conductive members 2 are arranged parallel to each other. In the sealing part 3, recesses 31 are formed in the positions in which the support members 4 are arranged.

As shown in FIGS. 3 and 4, in the accommodation step, the pair of conductive members 2 are accommodated in the die 5. Connection terminals 22 of the conductive members 2 are sandwiched by the die 5. As shown in FIG. 4, a central space $S_C$ is formed between the pair of conductive members 2. Further, outer spaces $S_O$ are formed between the individual conductive members 2 and the die 5 in the Z direction. The Z-direction length $W_C$ of the central space $S_C$ is longer than the Z-direction length $W_O$ of each outer space $S_O$. The central space $S_C$ and the outer spaces $S_O$ are in communication with each other.

Further, as shown in FIG. 4, a plurality of support members 4 are arranged outside the pair of conductive members 2 in the Z direction. The support members 4 are in contact with the outer surfaces $21_O$ of the conductive members 2. The individual support members 4 are pins $4p$ formed separately from the die 5.

As shown in FIGS. 5 and 6, in the sealing step, the resin 30 is injected from a gate 51 of the die 5. The pair of conductive members 2 are thereby sealed with the resin 30. The gate 51 is formed in a position adjacent to the central space $S_C$. The resin 30 is injected from the gate 51 toward the central space $S_C$. The resin 30 is injected from the gate 51 in a direction parallel to the pair of conductive members 2. As the gate 51, a fan gate, a side gate, a film gate, or the like can be used. Moreover, in the present embodiment, the Z-direction length $W_C$ of the central space $S_C$ (see FIG. 4) is longer than the Z-direction length $W_O$ of the outer spaces $S_O$, as described above. That is, the resin 30 is more likely to flow into the central space $S_C$ than into the outer spaces $S_O$. Therefore, the central space $S_C$ is completely filled with the resin 30 earlier than the outer spaces $S_O$. Accordingly, a force F is applied from the resin 30 to the individual conductive members 2 in directions away from each other. Moreover, in a pressure-maintaining step after the flow of the resin 30 is completed, a force F is applied to the conductive members 2 in directions away from each other, because the pressure loss of the resin 30 is larger in the outer spaces $S_O$ than in the central space $S_C$.

As shown in FIG. 6, the conductive members 2 are pressed against the support members 4 by the resin 30. Portions that are not in contact with the support members 4 in the conductive members 2 are slightly deformed due to the force F of the resin 30.

After the resin 30 is cooled and solidified, the die 5 is opened and the conductive member module 1 is extracted, as shown in FIGS. 7 and 8. In this case, one die $5_A$ is first removed, as shown in FIG. 7, and the support members 4 (pins $4p$) are then pushed out in the Z direction, as shown in FIG. 8. The conductive member module 1 is thereby released from the other die $5_B$.

Figure 9:
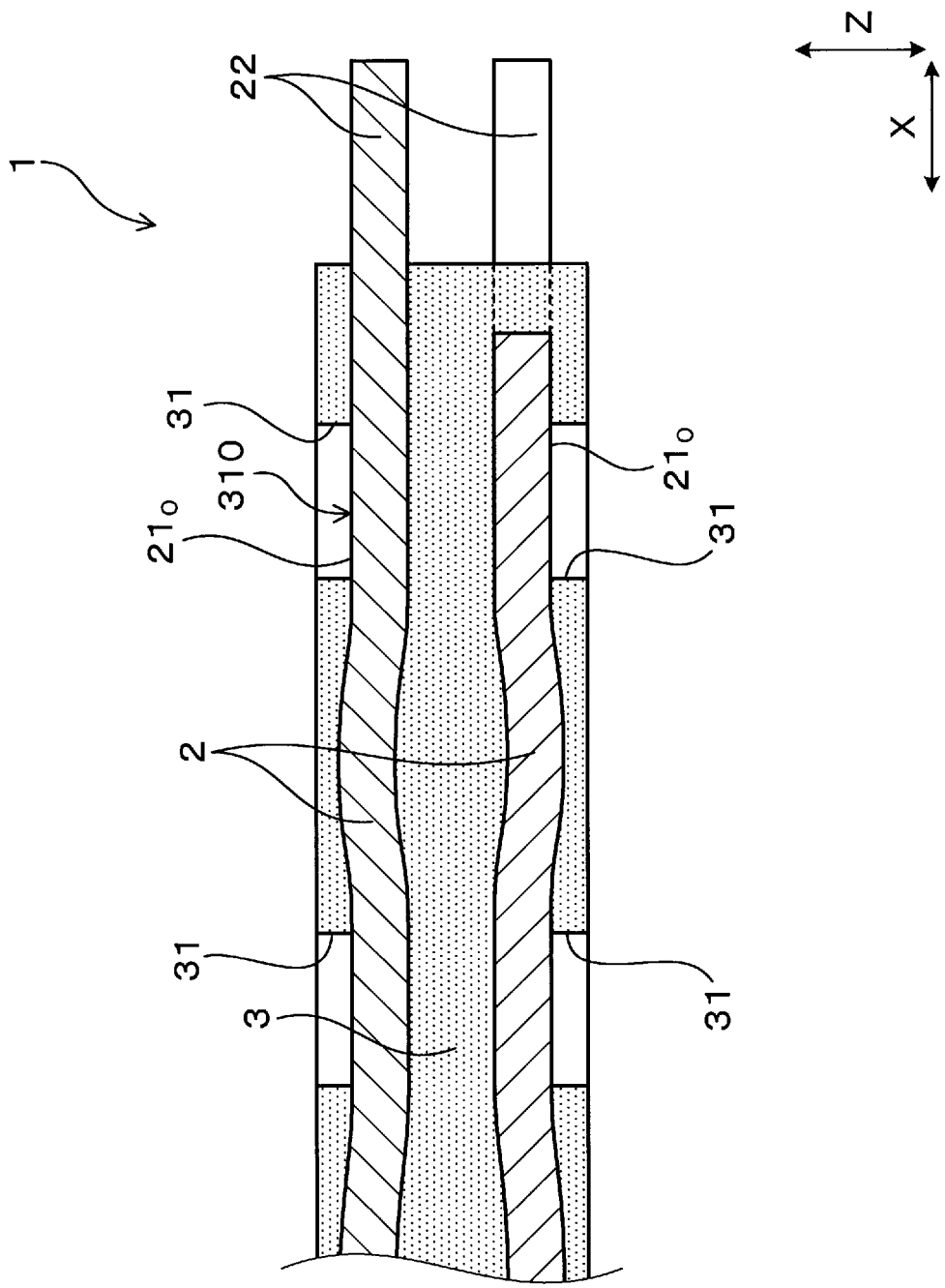
FIG. 9 is an enlarged sectional view of part of the conductive member module in the first embodiment.

FIG. 9 shows a partial sectional view of the manufactured conductive member module 1. As shown in this figure, recesses 31 are formed in the sealing part 3 in the positions in which the support members 4 are arranged. At bottom surfaces 310 of the recesses 31, the outer surfaces $21_O$ of the conductive members 2 are exposed. In the conductive members 2, portions in which their outer surfaces 21 are not exposed are slightly deformed due to the force F of the resin 30 applied in the sealing step (see FIG. 6).

Functions and effects of the present embodiment will be described. As shown in FIG. 6, in the sealing step of the present embodiment, the resin 30 applies a force to the individual conductive members 2 in directions away from each other in the Z direction. The conductive members 2 are sealed while the individual conductive members 2, to which the force F is applied, are supported by the support members 4 externally in the Z direction.

Therefore, in the sealing step, the pair of conductive members 2 are less likely to approach each other, and problems such as contact between the pair of conductive members 2 can be suppressed from occurring.

Further, since the pair of conductive members 2 are less likely to come into contact with each other in the present embodiment, the sealing step can be performed in a state in which the distance between the pair of conductive members 2 is narrowed. Therefore, the parasitic inductance between the pair of conductive members 2 can be reduced.

That is, in a conventional manufacturing method of a conductive member module 1, the resin 30 sometimes applied a force F to a pair of conductive members 2 in directions to approach each other, as shown in FIGS. 32 and 33. Accordingly, there was a possibility that the pair of conductive members 2 came into contact with each other, resulting in insulation failure. In contrast, as in the present embodiment, when the resin 30 applies a force F to the pair of conductive members 2 in directions away from each other, the problem that the conductive members 2 come into contact with each other can be suppressed from occurring.

Moreover, when the manufacturing method of the present embodiment is employed, the manufacturing cost of the conductive member module 1 can be reduced.

That is, the sealing step can also be performed after a resin is interposed between the pair of conductive members 2, followed by accommodation in the die 5; however, in this case, the number of steps may increase, and the amount of resin used may increase. In contrast, in the manufacturing method of the present embodiment, the pair of conductive members 2 are sealed in the sealing step without interposing a resin between the pair of conductive members 2; thus, the number of steps and the amount of resin used can be reduced, and the manufacturing cost of the conductive member module 1 can be reduced.

As shown in FIG. 5, in the sealing step of the present embodiment, the central space $S_C$ is completely filled with the resin 30 earlier than the outer spaces $S_O$ are.

Therefore, the force F can be easily applied by the resin 30 to the individual conductive member 2 in directions away from each other.

As shown in FIG. 5, the central space $S_C$ has a larger width W in the Z direction than the individual outer spaces $S_O$ have.

Therefore, the resin 30 is likely to flow into the central space $S_C$, and the resin 30 can easily apply a force F to the individual conductive members 2 in directions away from each other.

As shown in FIGS. 5 and 6, in the present embodiment, the gate 51 is formed in a position adjacent to the central space $S_C$. The resin 30 is injected from the gate 51 into the central space $S_C$ in a direction parallel to the conductive members 2.

Therefore, the resin 30 is likely to flow into the central space $S_C$, and the force F is easily applied to the individual conductive members 2 in directions away from each other.

Moreover, the support members 4 of the present embodiment are formed separately from the die 5.

Therefore, the support members 4 can be easily replaced when they are worn.

As shown in FIG. 8, the support members 4 of the present embodiment also serve as release pins $4_{EP}$ for releasing the conductive member module 1 from the die 5.

Accordingly, it is not necessary to separately provide dedicated release pins $4_{EP}$, and the distance L between the support members 4 can be narrowed. Therefore, the amount of deformation of the conductive members 2 due to the force F applied from the resin 30 can be reduced.

As shown in FIGS. 2 and 6, in the present embodiment, no through holes are formed in the conductive members 2.

Figure 15:
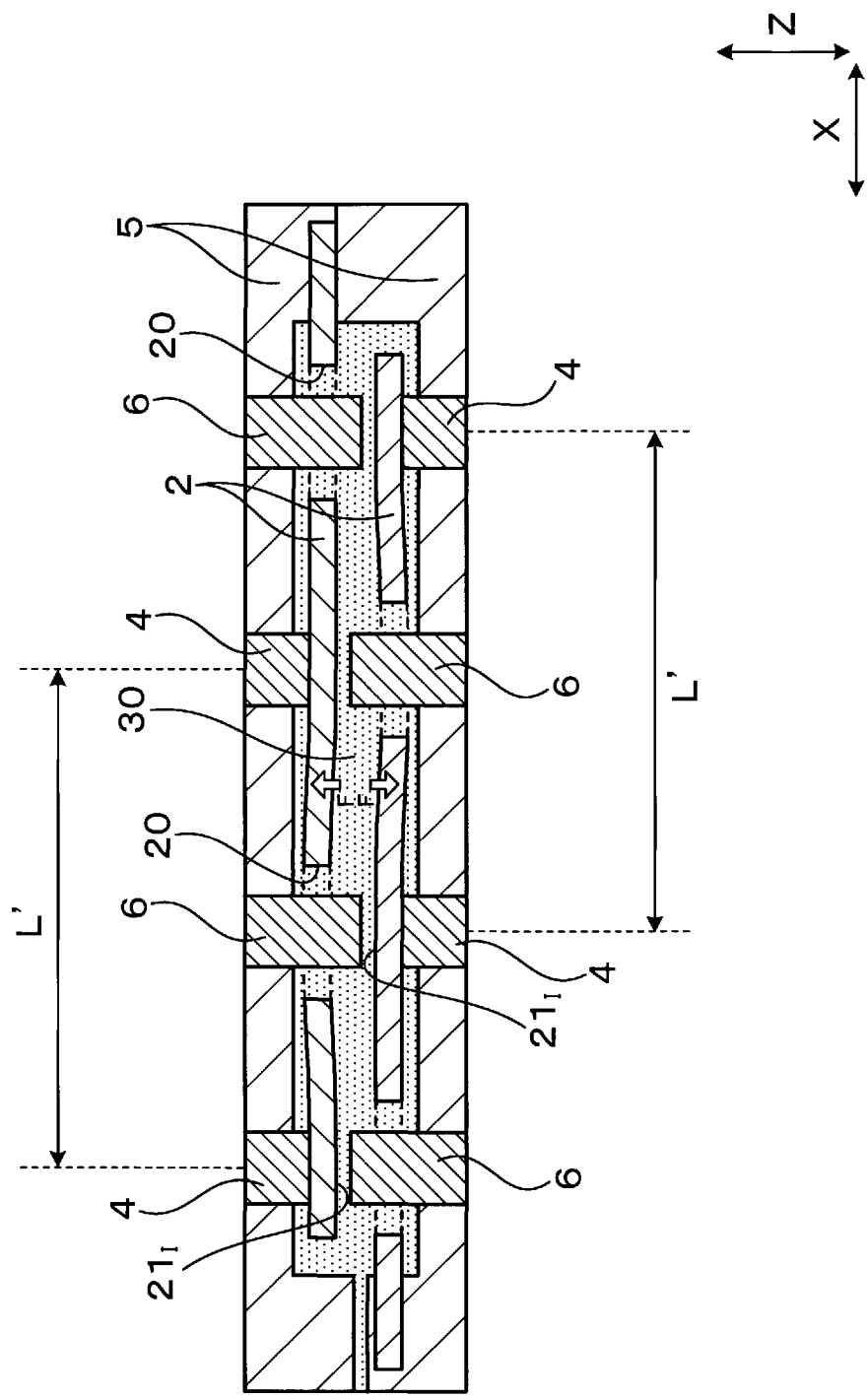
FIG. 15 is an explanatory view of the manufacturing method following FIG. 14.

Therefore, the distance L between the support members 4 can be easily narrowed. That is, as shown in FIG. 15, the pair of conductive members 2 can be sealed in the sealing step, while forming through holes 20 in the conductive members 2, and inserting through hole insertion pins 6 into the through holes 20. However, in this case, due to the presence of the through hole insertion pins 6, the distance L' between the plurality of support members 4 may be increased. Thus, there may be a possibility that the conductive members 2 are likely to be deformed due to the force F of the resin 30. In contrast, as shown in FIG. 6, when the through holes 20 are not formed, as in the present embodiment, the distance L between the support members 4 can be reduced, and the deformation of the conductive members 2 due to the force F of the resin 30 can be effectively suppressed from occurring. Therefore, it is possible to reduce product variations in the parasitic inductance between the pair of conductive members 2.

As described above, the present embodiment makes it possible to provide a manufacturing method of a conductive member module that can reduce the inductance between a pair of conductive members and that can sufficiently enhance the insulation properties between the pair of conductive members.

Figure 11:
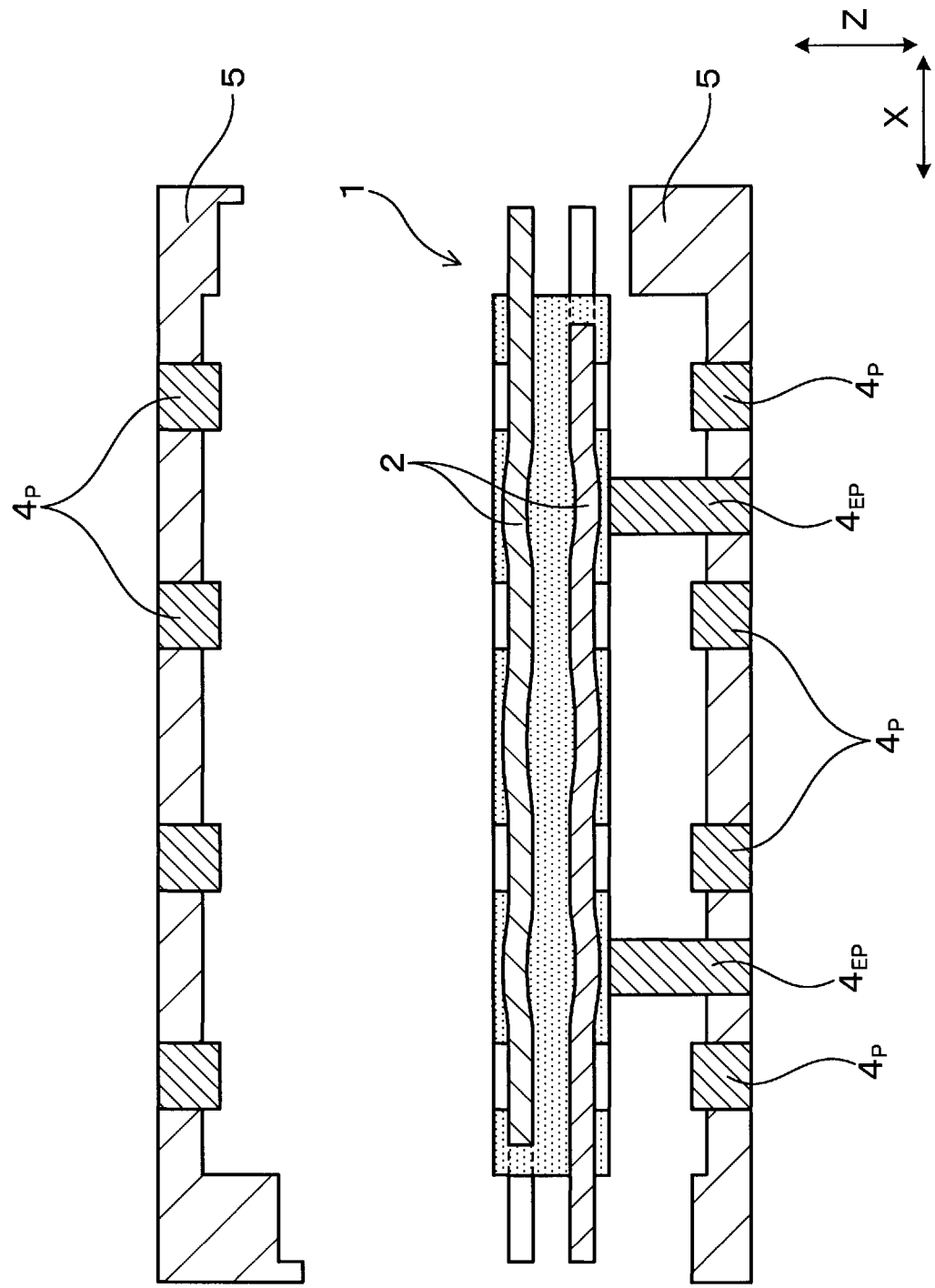
FIG. 11 is an explanatory view of the manufacturing method of the conductive member module in the first embodiment when dedicated release pins are used for releasing.

In the present embodiment, the support members 4 also serve as release pins $4_{EP}$, as shown in FIG. 8; however, the present disclosure is not limited thereto. That is, dedicated release pins $4_{EP}$ may be provided separately from the support members 4, as shown in FIG. 11.

In the following embodiments, among the reference numerals used in the drawings, those that are the same as the reference numerals used in the first embodiment represent the same constituents as those of the first embodiment, unless otherwise indicated.

Second Embodiment

Figure 12:
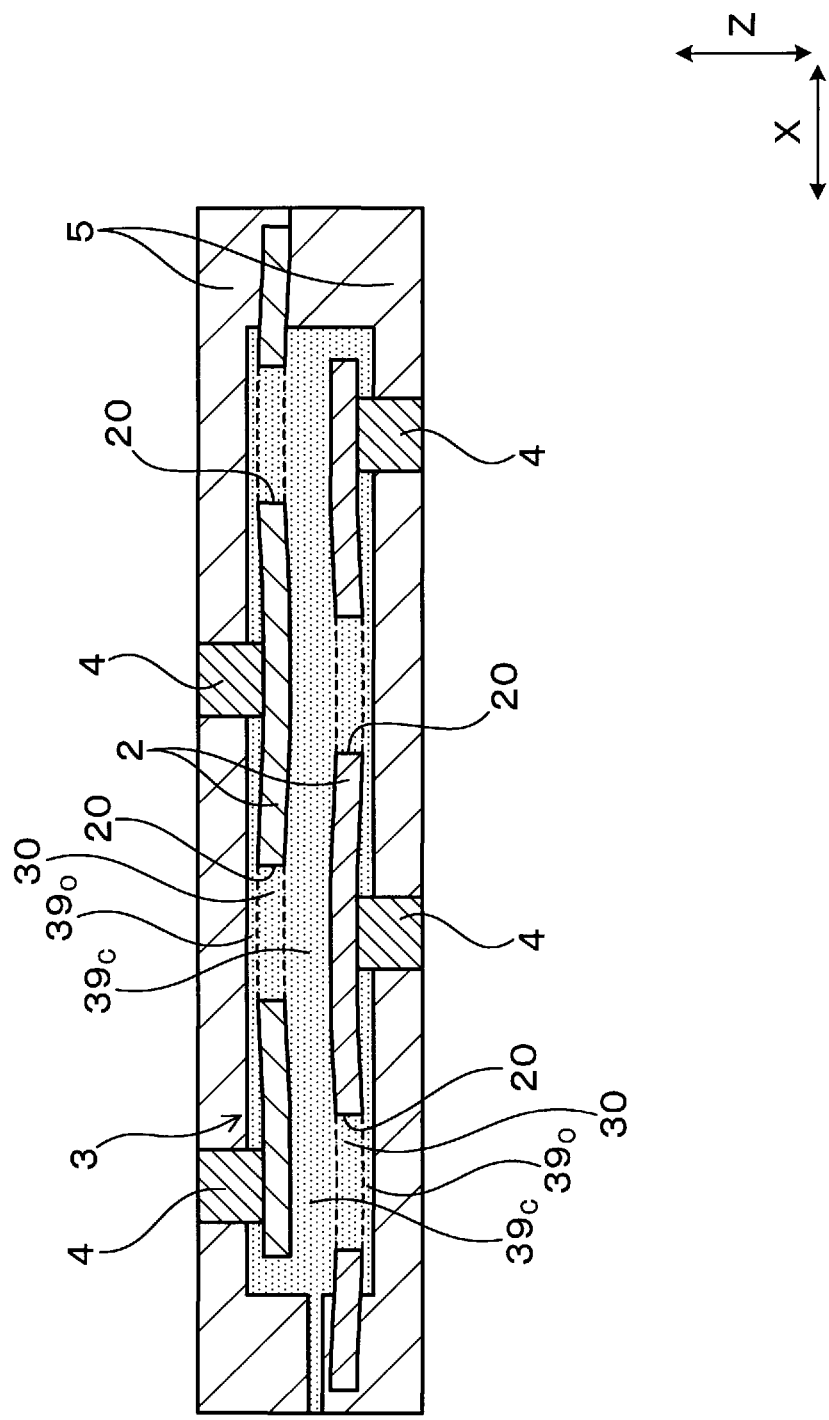
FIG. 12 is an explanatory view of a manufacturing method of a conductive member module in a second embodiment.

The present embodiment is an example in which the shape of the conductive members 2 is changed. As shown in FIG. 12, in the present embodiment, through holes 20 penetrating in the Z direction are formed in the individual conductive members 2. In the sealing step, the resin 30 flows into the through holes 20.

In this manner, of the sealing part 3, portions $39c$ present between the pair of conductive members 2 and portions $39_O$ present outside the pair of conductive members 2 can be connected by the resin 30 in the through holes 20. Accordingly, these portions $39C$ and $39_O$ can be firmly connected, and the sealing part 3 can be firmly formed as a whole. Further, the adhesion between the sealing part 3 and the conductive members 2 can be enhanced by the resin 30 in the through holes 20. Therefore, even if cooling and heating cycles are added, and the sealing part 3 is repeatedly expanded and contracted, problems such as peeling of the sealing part 3 from the conductive members 2 can be suppressed from occurring.

Other than the above, the present embodiment has the same configurations, functions and effects as those of the first embodiment.

Third Embodiment

Figure 13:
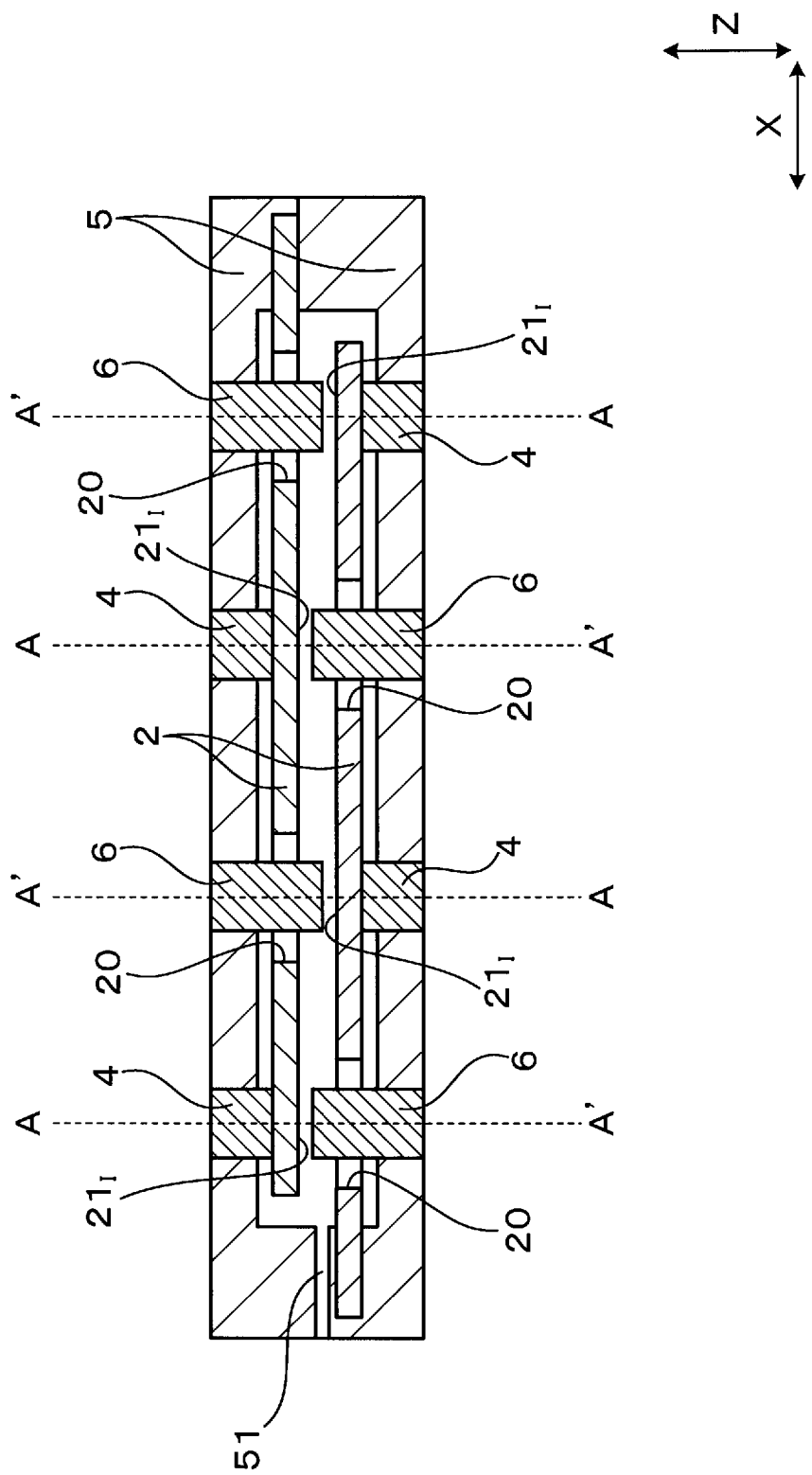
FIG. 13 is an explanatory view of a manufacturing method of a conductive member module in a third embodiment.

The present embodiment is an example in which the shape etc. of the conductive members 2 are changed. As shown in FIG. 13, in the present embodiment, through holes 20 are formed in the individual conductive members 2, similarly to the second embodiment. Further, in the present embodiment, an accommodation step (see FIG. 13), a sealing step (see FIGS. 14 and 15), and an extraction step (see FIG. 16) are performed, similarly to the first embodiment. As shown in FIG. 13, in the accommodation step, a pair of conductive members 2 are arranged in a die 5, the conductive members 2 are supported externally by support members 4, and through hole insertion pins 6 are inserted into the through holes 20. The tips of the through hole insertion pins 6 are separated from the inner surfaces $21_I$ of the conductive members 2. Moreover, the support members 4 and the through hole insertion pins 6 are arranged concentrically. That is, the axis A of the support member 4 and the axis A' of the through hole insertion pin 6 coincide with each other.

Figure 14:
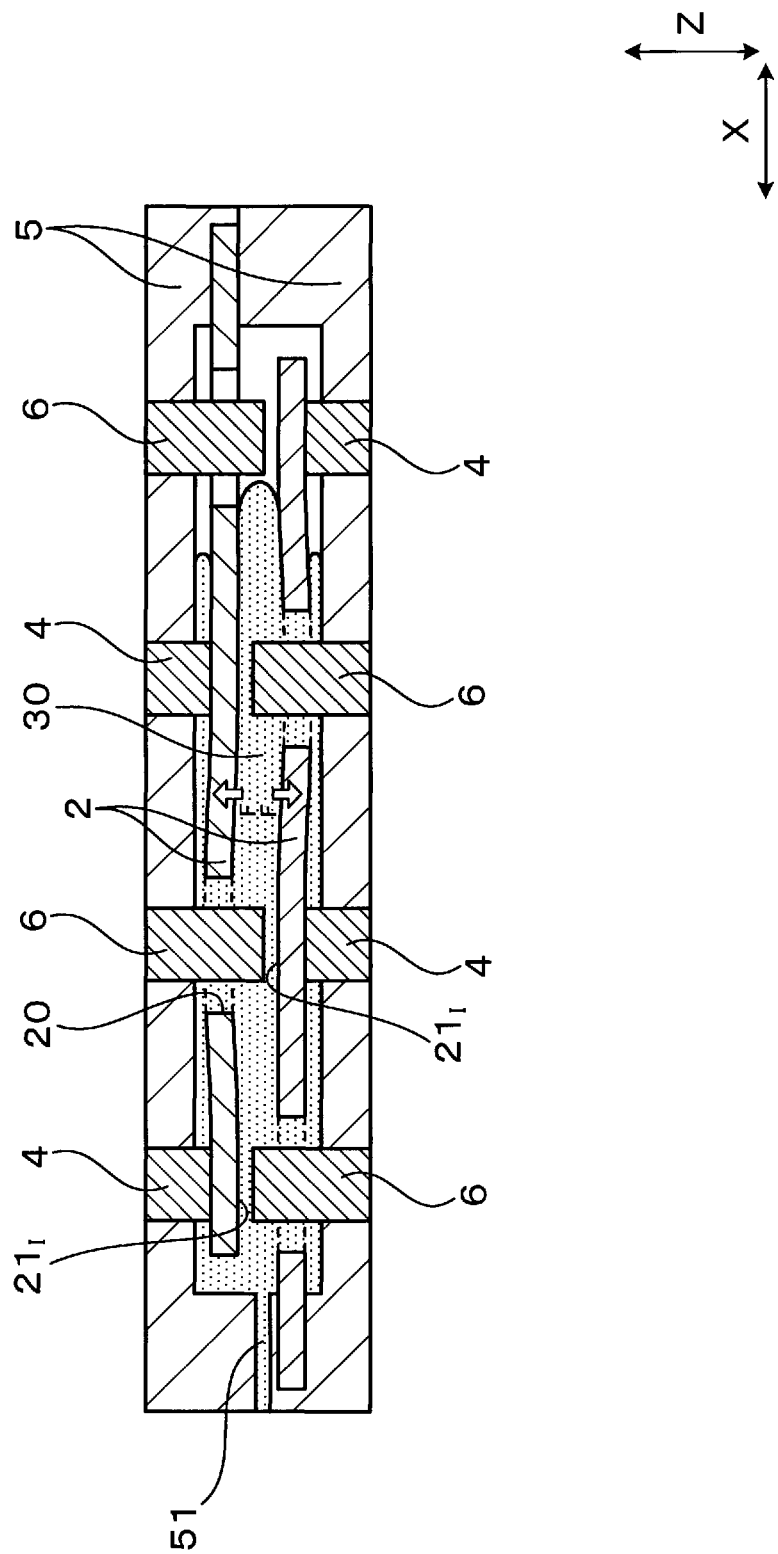
FIG. 14 is an explanatory view of the manufacturing method following FIG. 13.

While the through hole insertion pins 6 are inserted in this manner, the sealing step is performed, as shown in FIGS. 14 and 15. In the sealing step, the resin 30 applies a force F to the pair of conductive members 2 in directions away from each other, similarly to the first embodiment. The contact between the pair of conductive members 2 is thereby suppressed from occurring. Even if the conductive members 2 approach each other, the conductive members 2 come into contact with the through hole insertion pins 6. Therefore, the contact between the pair of conductive members 2 can be suppressed from occurring.

Figure 16:
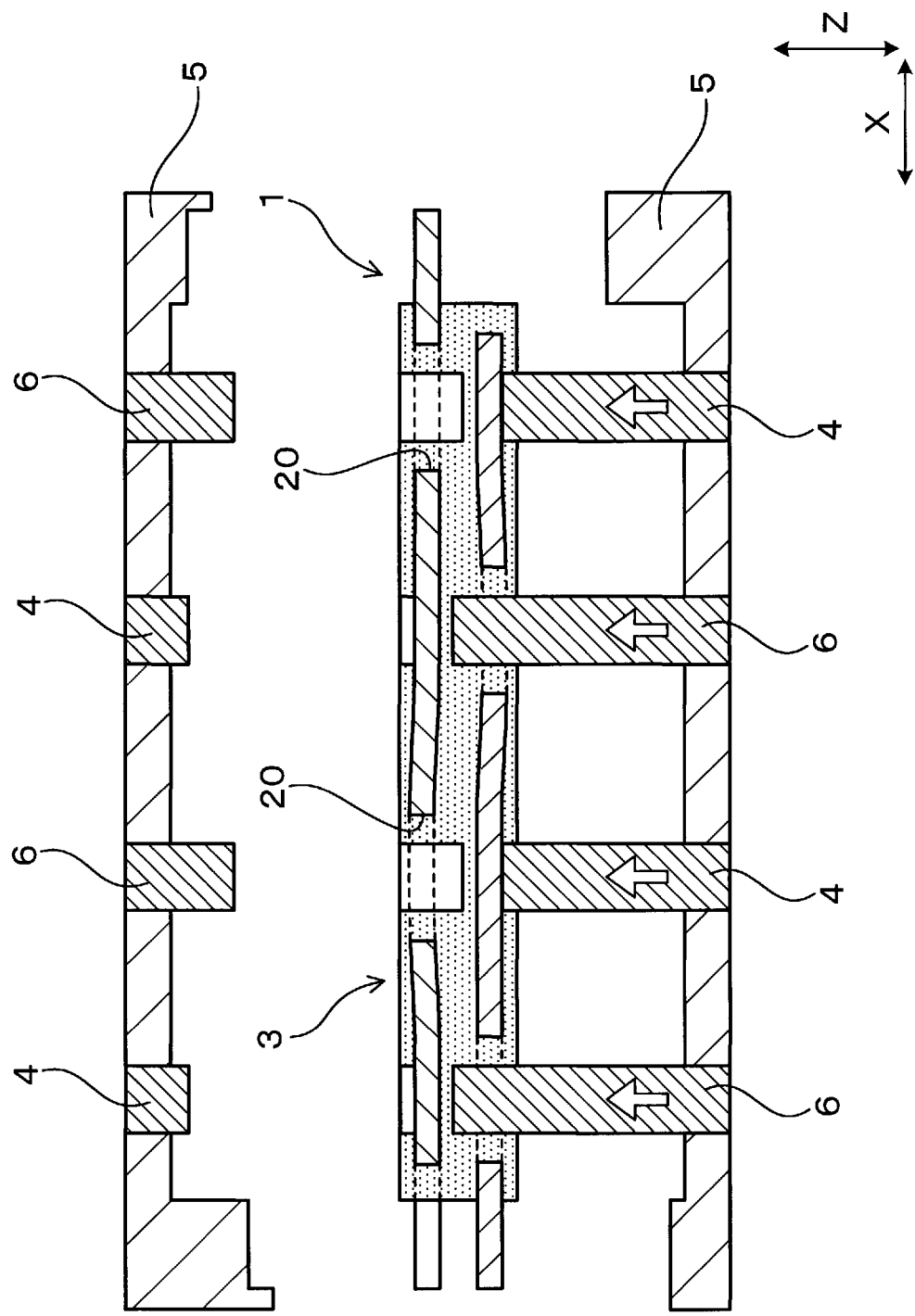
FIG. 16 is an explanatory view of the manufacturing method following FIG. 15.

After the sealing step is performed, the extraction step is performed, as shown in FIG. 16. As shown in this figure, in the extraction step, the die 5 is first opened, and the support members 4 and the through hole insertion pins 6 are then pushed out in the Z direction. The conductive member module 1 is thereby released.

Figure 17:
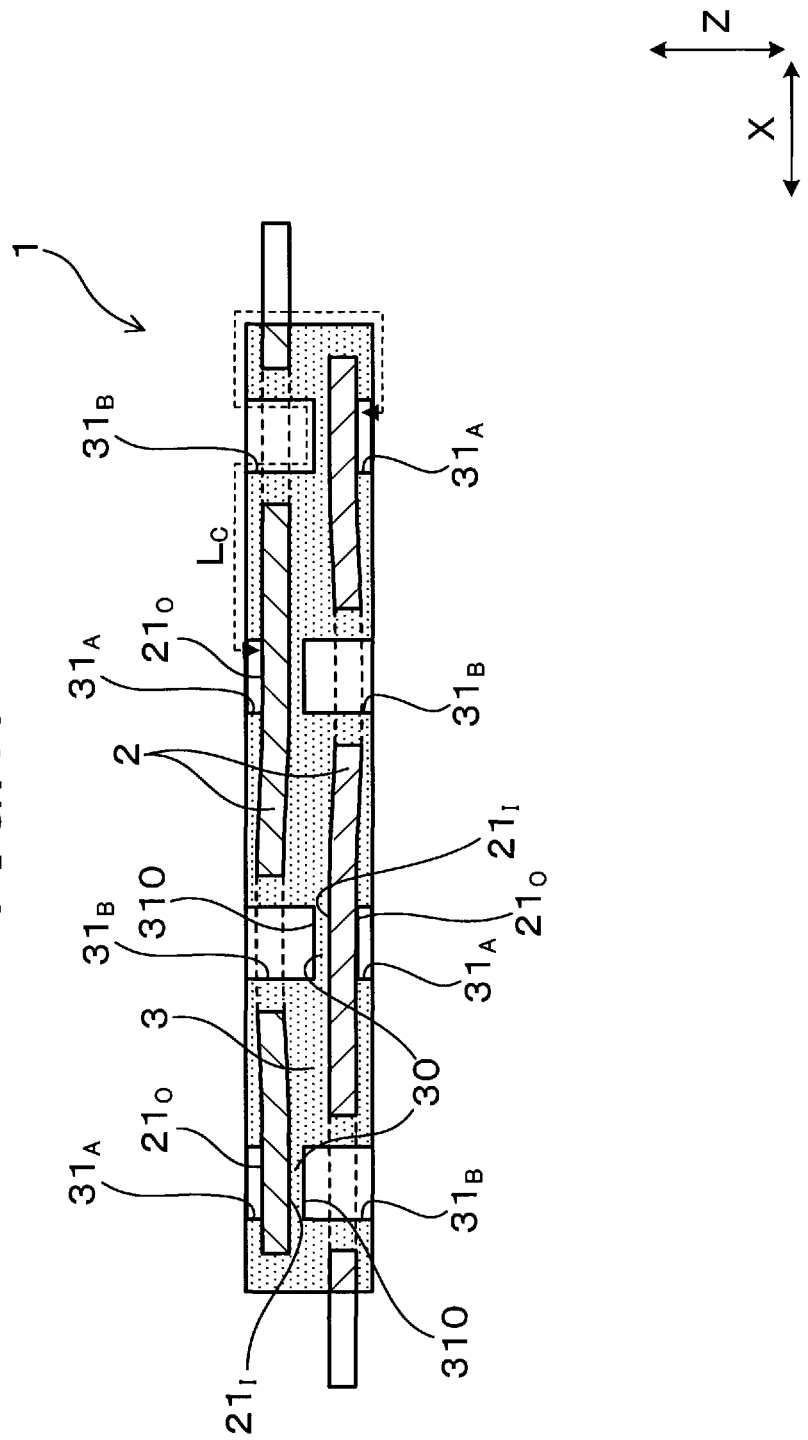
FIG. 17 is a sectional view of the conductive member module in the third embodiment.

FIG. 17 shows a sectional view of the manufactured conductive member module 1. As shown in this figure, the conductive member module 1 includes a pair of conductive members 2, a sealing part 3, through holes 20 formed in the individual conductive members 2, first recesses $31_A$, and second recesses $31_B$. The first recesses $31_A$ are recesses 31 formed in the positions in which the support members 4 are arranged. At the bottom of the first recesses $31_A$, the outer surfaces 210 of the conductive members 2 are exposed.

The second recesses $31_B$ are recesses 31 formed in the positions in which the through hole insertion pins 6 are arranged. The second recesses $31_B$ are formed so as to be recessed in the Z direction through the through holes 20 from the outside to the inside of the pair of conductive members 2.

The resin 30 constituting the sealing part 3 is partially present between the inner surfaces $21_I$ of the conductive members 2 and the bottom surfaces 310 of the second recesses $31_B$.

The functions and effects of the present embodiment will be described. As shown in FIGS. 13 to 15, in the present embodiment, the sealing step is performed in a state in which the through hole insertion pins 6 are inserted into the through holes 20.

In this manner, the entire inside of the through holes 20 is not sealed with the resin 30. Therefore, the thickness of the resin 30 present inside the through holes 20 does not increase, thereby suppressing the generation of voids, sink marks, etc. Therefore, the problem that the insulation properties between the pair of conductive members 2 are reduced due to voids etc. can be suppressed from occurring.

Further, in the present embodiment, the tips of the through hole insertion pins 6 are separated from the inner surfaces $21_I$ of the conductive members 2 in the sealing step.

This can suppress the exposure of the inner surfaces $21_I$ of the conductive members 2 from the bottom surfaces 310 of the second recesses $31_B$ formed by the through hole insertion pins 6, as shown in FIG. 17. Therefore, only the outer surfaces 210 of the conductive members 2 are exposed, and the creepage distance $L_C$ between the pair of conductive members 2 can be increased. The insulation properties between the pair of conductive members 2 can be thereby further enhanced.

That is, as shown in FIG. 32, in a conventional manufacturing method of a conductive member module 1, the through hole insertion pins 6 were brought into contact with the inner surfaces $21_I$ of the conductive members 2. Therefore, as shown in FIG. 34, even if a conductive member module 1 is normally manufactured without contact between the pair of conductive members 2, one conductive member $2_A$ is exposed at the bottom of the first recess $31_A$, and the other conductive member $2_B$ is exposed at the bottom of the second recess $31_B$ formed adjacent to the first recess $31_A$; thus, the creepage distance $L_C$ between the pair of conductive members $2_A$ and $2_B$ is reduced. Therefore, the insulation properties between the pair of conductive members $2_A$ and $2_B$ are likely to be reduced. In contrast, when the sealing step is performed in a state in which the through hole insertion pins 6 are separated from the inner surfaces $21_I$ of the conductive members 2, as in the present embodiment, the resin 30 can be interposed between the bottom surfaces 310 of the second recesses $31_B$ formed by the through hole insertion pins 6 and the inner surfaces $21_I$ of the conductive members 2, as shown in FIG. 17. Accordingly, only the outer surfaces $21_O$ of the conductive members 2 are exposed. Therefore, the creepage distance $L_C$ between the pair of conductive members 2 can be increased, and the insulation properties between the pair of conductive members 2 can be enhanced.

Other than the above, the present embodiment has the same configurations, functions and effects as those of the first embodiment.

Figure 18:
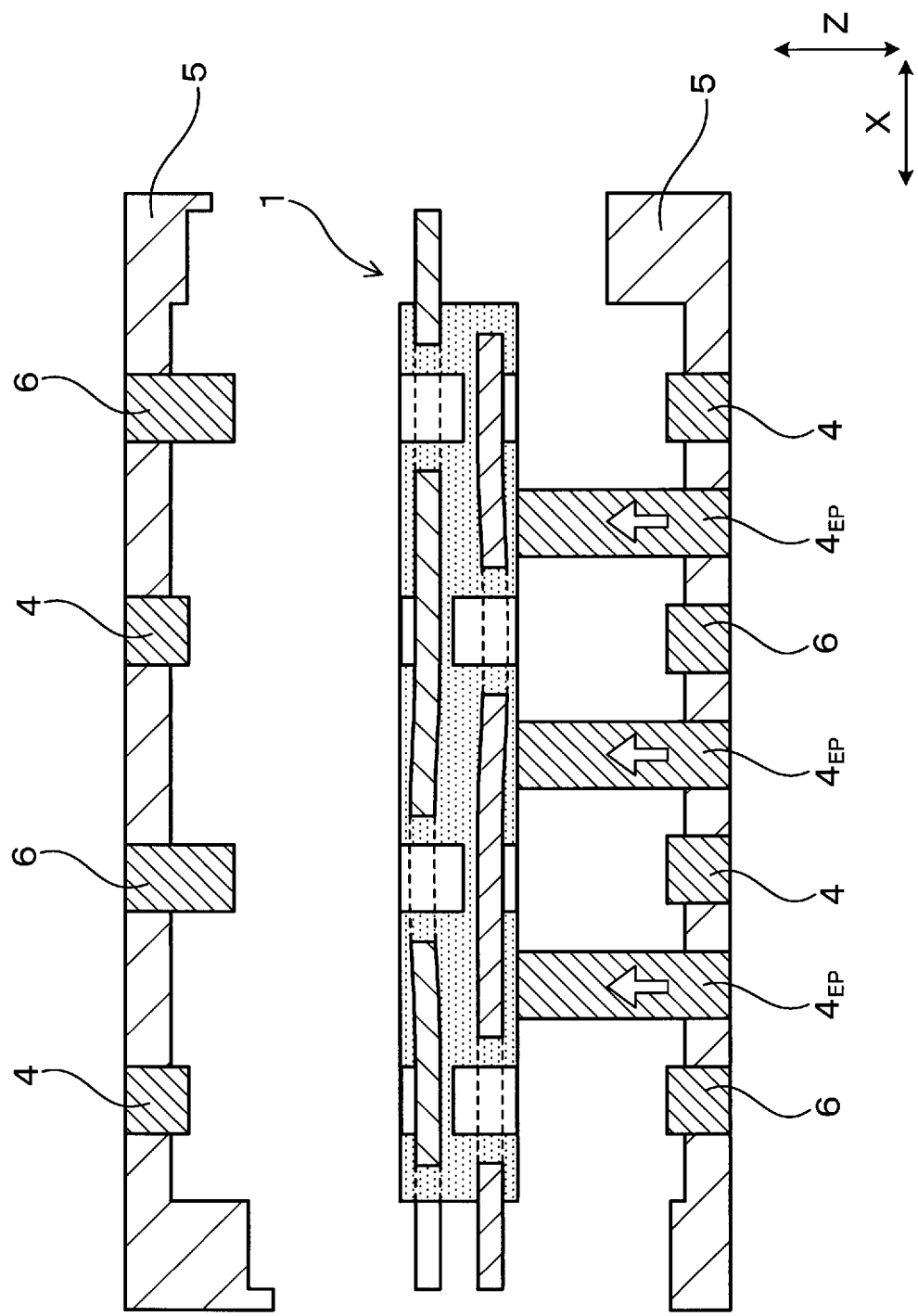
FIG. 18 is an explanatory view of the manufacturing method of the conductive member module in the third embodiment when dedicated release pins are used for releasing.

In the present embodiment, as shown in FIG. 16, the support members 4 and the through hole insertion pins 6 are also used as release pins for releasing the conductive member module 1 in the extraction step; however, the present disclosure is not limited thereto. That is, as shown in FIG. 18, dedicated release pins $4_{EP}$ may be provided separately from the support members 4 and the through hole insertion pins 6.

Fourth Embodiment

Figure 19:
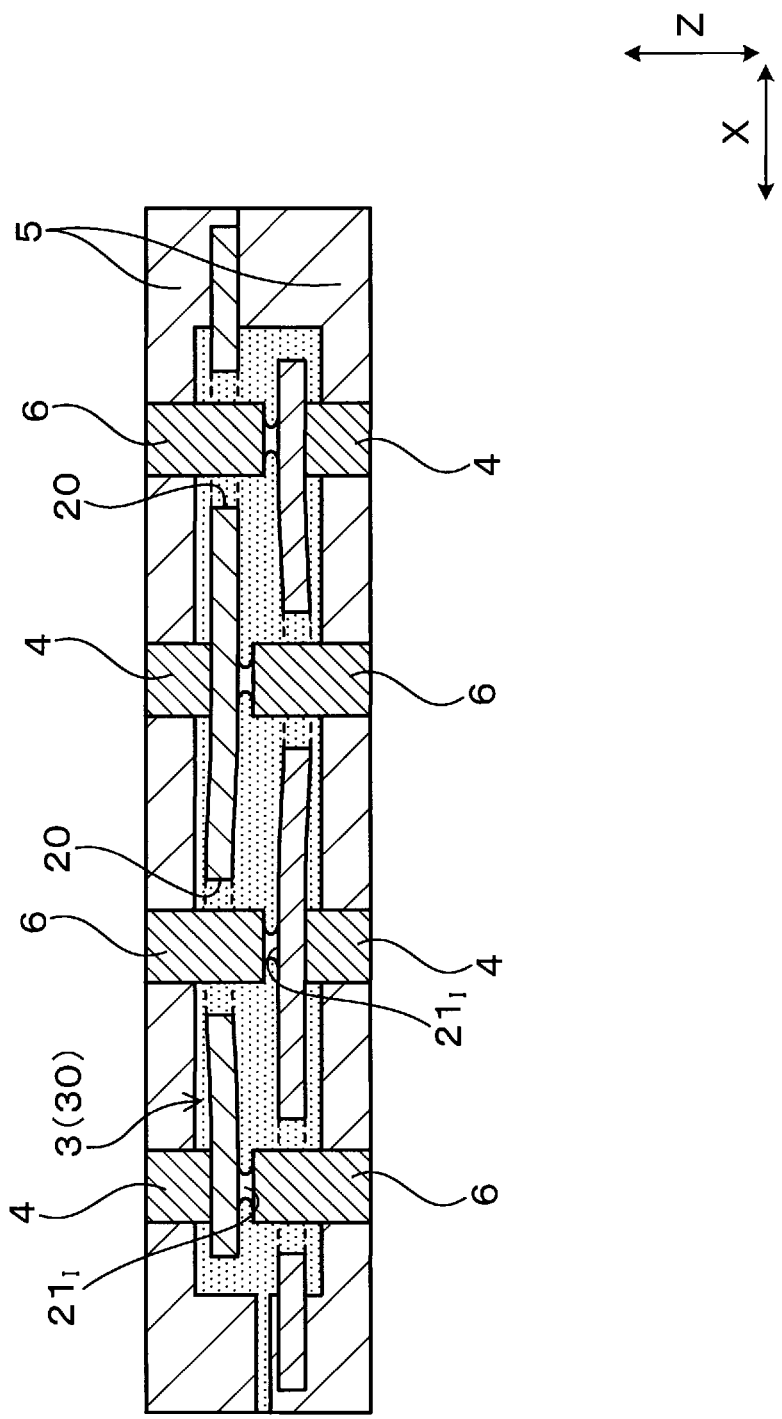
FIG. 19 is an explanatory view of a manufacturing method of a conductive member module in a fourth embodiment.
Figure 20:
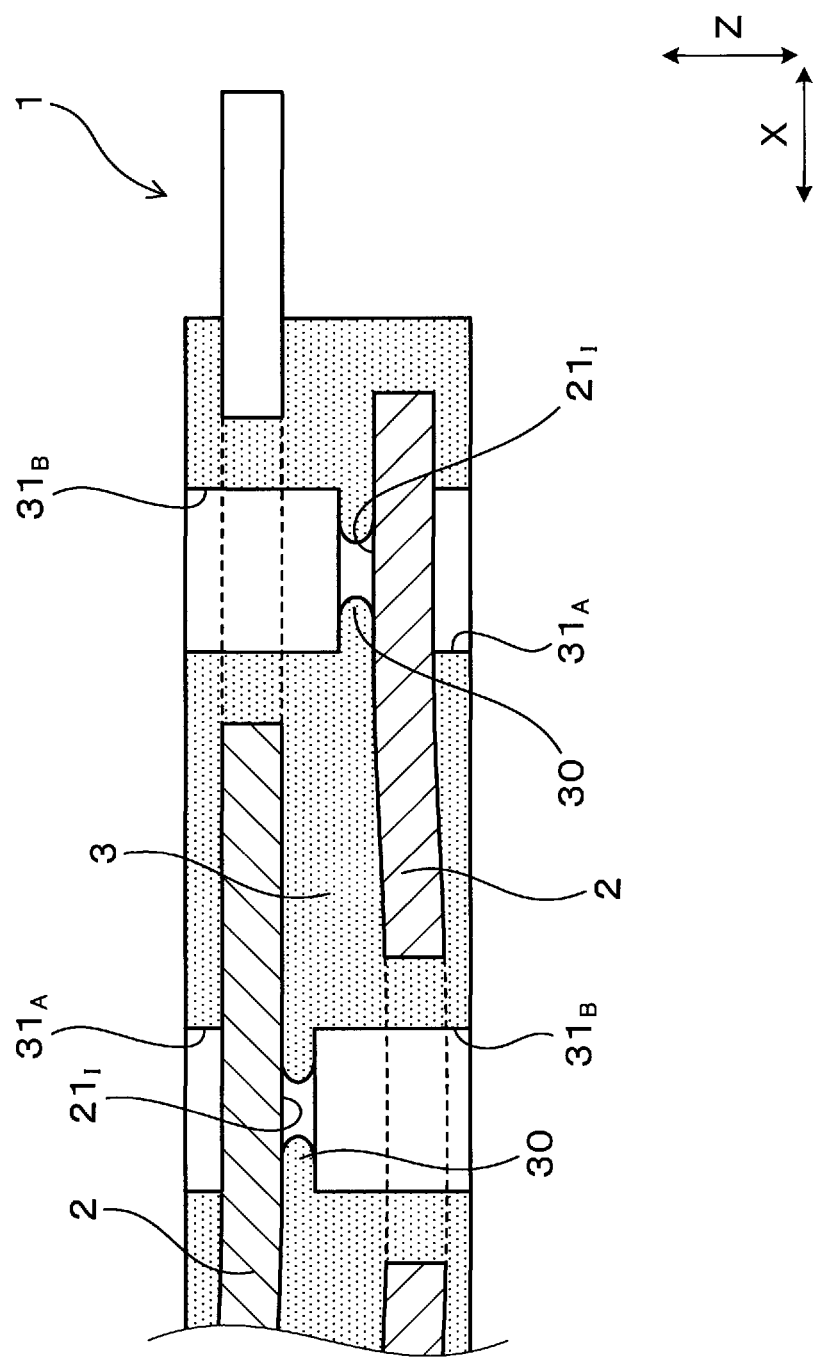
FIG. 20 is a partially enlarged sectional view of the conductive member module in the fourth embodiment.

The present embodiment is an example in which the sealing step is changed. As shown in FIGS. 19 and 20, in the present embodiment, the sealing step is performed in a state in which the through hole insertion pins 6 are inserted into the through holes 20 of the conductive members 2, similarly to the third embodiment. The tips of the through hole insertion pins 6 are not in contact with the inner surfaces $21_I$ of the conductive members 2. When the sealing step is performed, the resin 30 flows between the tips of the through hole insertion pins 6 and the inner surfaces $21_I$ of the conductive members 2; however, the space therebetween is not completely filled with the resin 30. Therefore, as shown in FIG. 20, in the manufactured conductive member module 1, the inner surfaces $21_I$ of the conductive members 2 are exposed at the bottom of the second recesses $31_B$ formed by the through hole insertion pins 6.

Other than the above, the present embodiment has the same configurations, functions and effects as those of the first embodiment.

Fifth Embodiment

Figure 21:
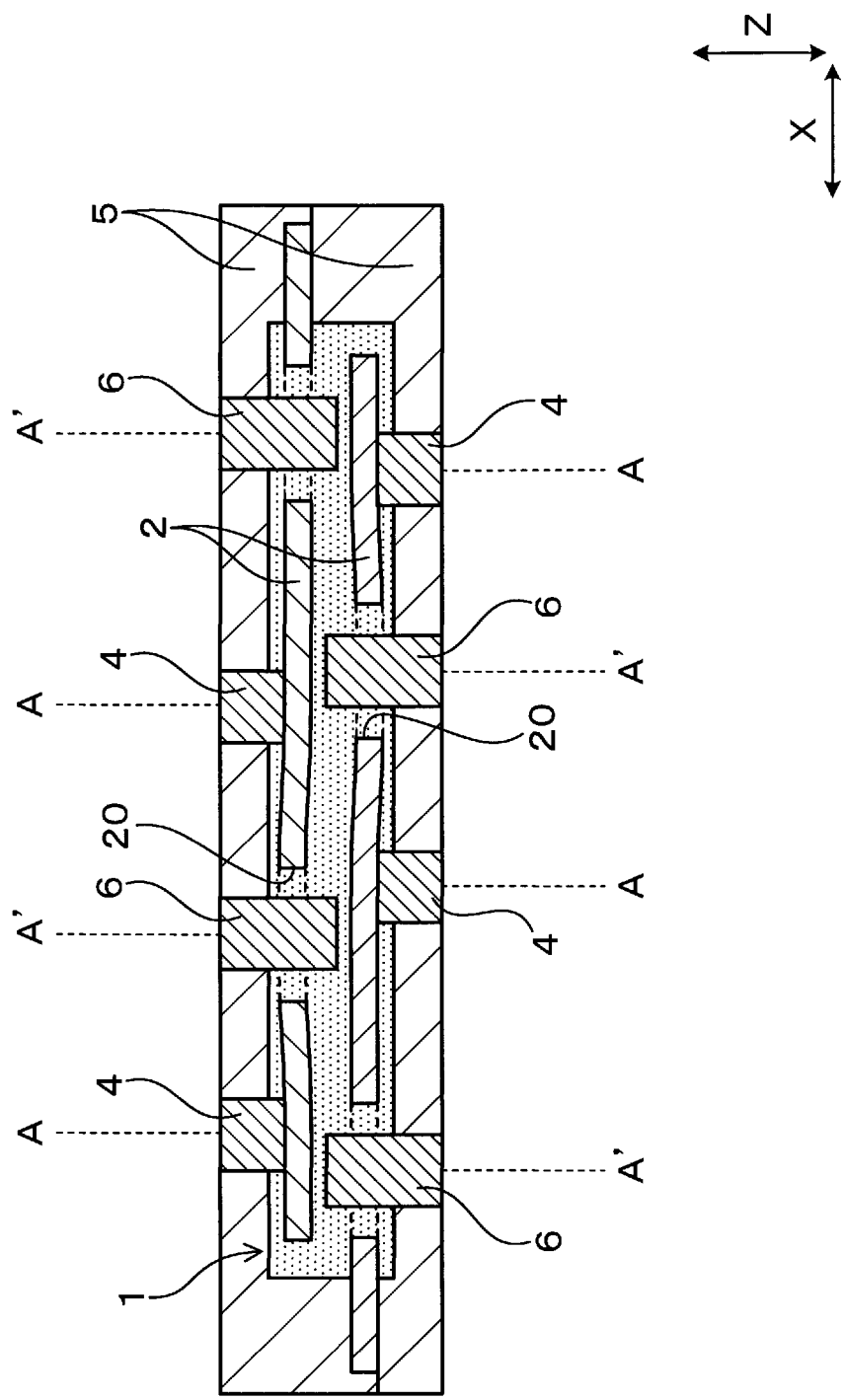
FIG. 21 is an explanatory view of a manufacturing method of a conductive member module in a fifth embodiment.

The present embodiment is an example in which the arrangement positions of the through hole insertion pins 6 are changed. As shown in FIG. 21, in the present embodiment, the support members 4 and the through hole insertion pins 6 are not arranged concentrically. That is, the axis A of the support member 4 and the axis A' of the through hole insertion pin 6 do not coincide with each other.

Other than the above, the present embodiment has the same configurations, functions and effects as those of the first embodiment.

Sixth Embodiment

Figure 22:
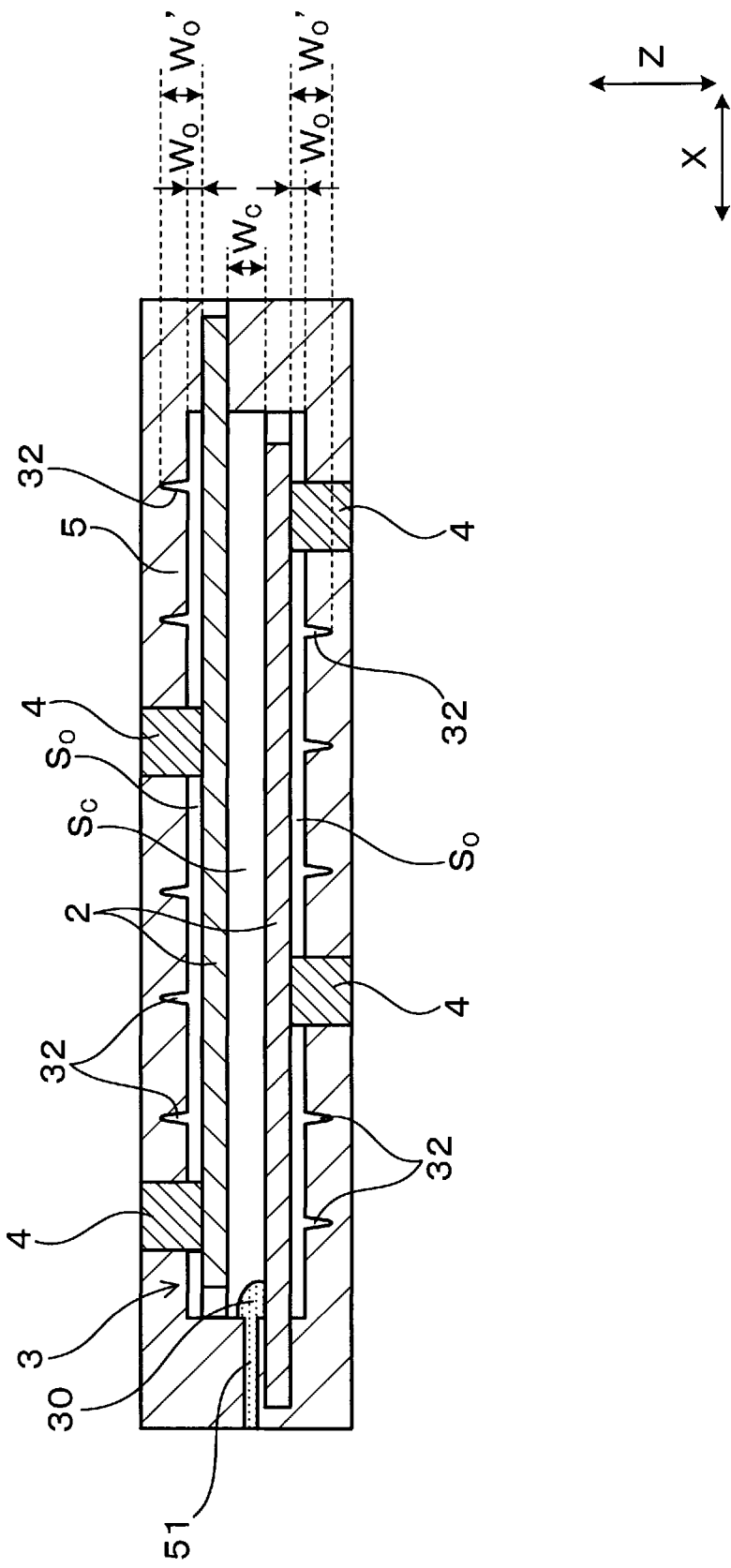
FIG. 22 is an explanatory view of a manufacturing method of a conductive member module in a sixth embodiment.
Figure 23:
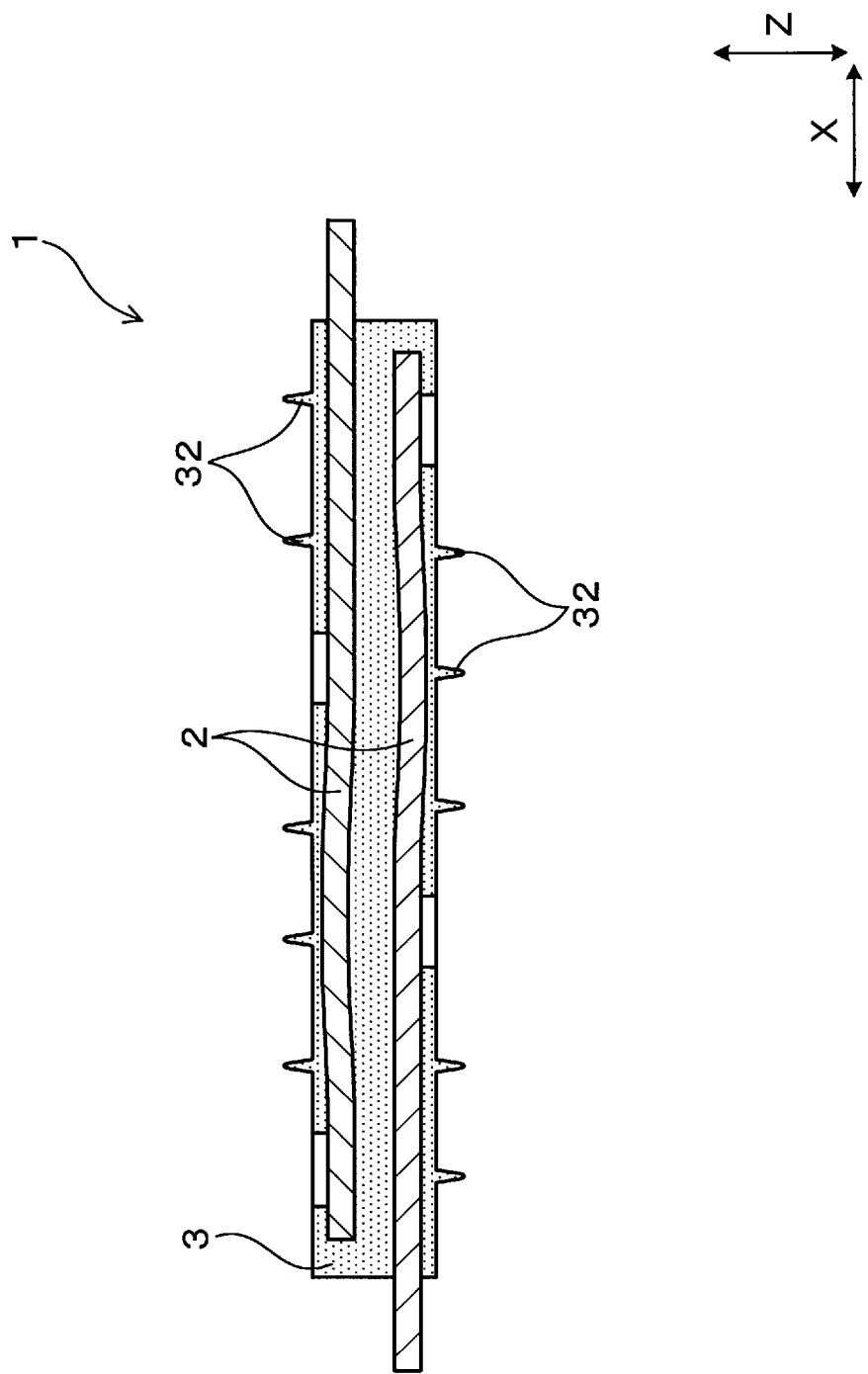
FIG. 23 is a sectional view of the conductive member module in the sixth embodiment.

The present embodiment is an example in which the shape of the sealing part 3 is changed. As shown in FIGS. 22 and 23, in the present embodiment, the sealing part 3 is provided with ribs 32 projecting in the Z direction. Similar to the first embodiment, a central space $S_C$ formed between a pair of conductive members 2 and outer spaces $S_O$ formed between the individual conductive members 2 and a die 5 in the Z direction are present in the die 5. The Z-direction length $W_C$ of the central space $S_C$ is longer than the length $W_O$ of the outer spaces $S_O$, not including the length of the ribs 32. Further, the Z-direction length $W_C$ of the central space $S_C$ is shorter than the length $W_O'$ of the outer spaces $S_O$, including the length of the ribs 32.

The functions and effects of the present embodiment will be described. In the present embodiment, the ribs 32 formed in the sealing part 3 can increase the rigidity of the sealing part 3. Further, in the present embodiment, the Z-direction length $W_C$ of the central space $S_C$ is longer than the length $W_O$ of the outer spaces $S_O$, not including the length of the ribs 32. Accordingly, the resin 30 is more likely to flow into the central space $S_C$ than into the outer spaces $S_O$. Therefore, the central space $S_C$ is completely filled with the resin 30 earlier than the outer spaces $S_O$, and the resin 30 can apply a force F to the pair of conductive members 2 in directions away from each other. Consequently, the problem that the pair of conductive members 2 come into contact with each other can be effectively suppressed from occurring.

Other than the above, the present embodiment has the same configurations, functions and effects as those of the first embodiment.

Seventh Embodiment

Figure 24:
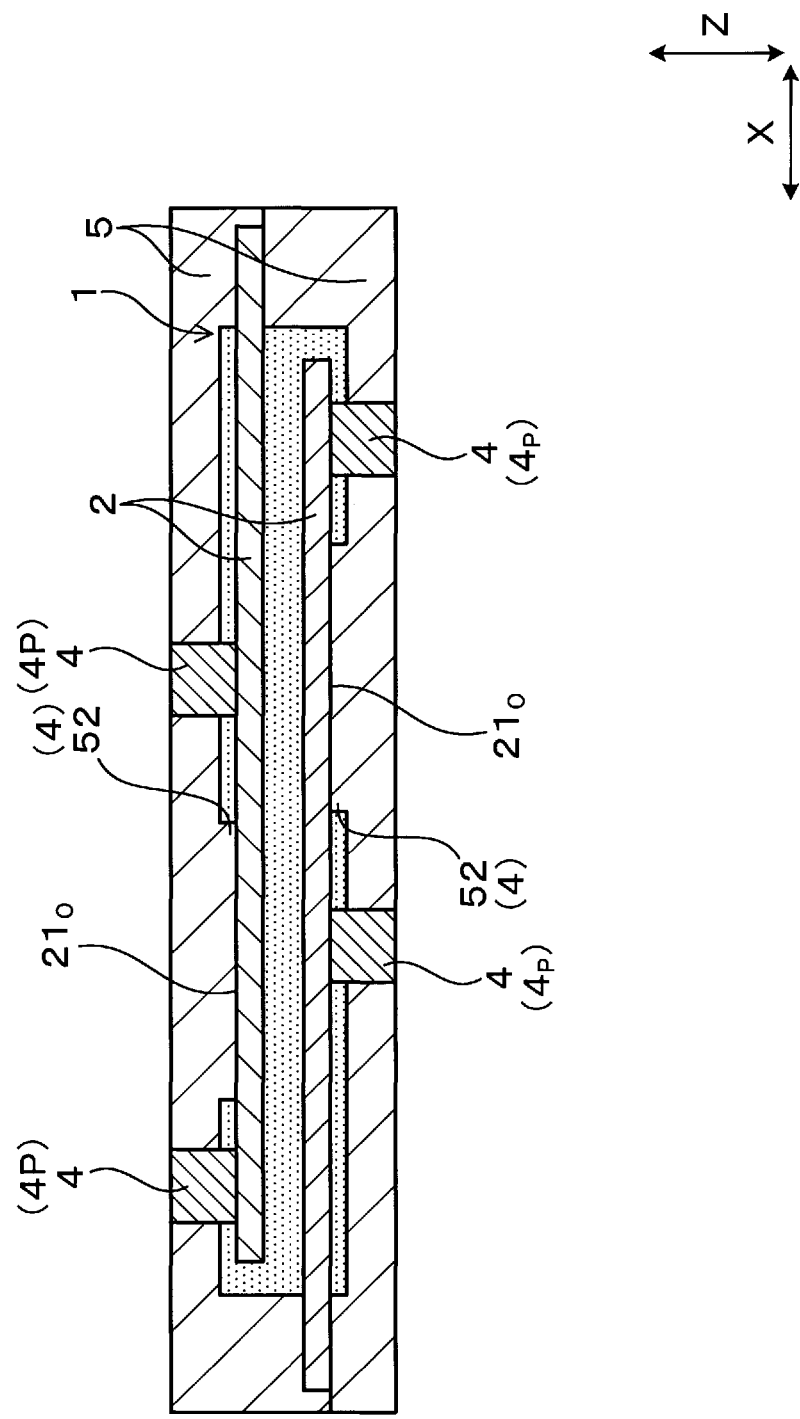
FIG. 24 is an explanatory view of a manufacturing method of a conductive member module in a seventh embodiment.

The present embodiment is an example in which the shape of the die 5 is changed. As shown in FIG. 24, in the present embodiment, the die 5 is provided with support projections 52 projecting toward the conductive member 2 sides in the Z direction. The support projections 52 are in contact with the outer surfaces $21_O$ of the conductive members 2. Further, pins $4_P$ formed separately from the die 5 are disposed outside the conductive members 2. In the sealing step, the conductive members 2 are supported using the support projections 52 and the pins $4_P$. That is, in the present embodiment, the support projections 52 and the pins $4_P$ are used as support members 4.

With the above configuration, the number of pins $4_P$ can be reduced. Therefore, the number of parts required to produce the conductive member module 1 can be reduced.

Other than the above, the present embodiment has the same configurations, functions and effects as those of the first embodiment.

Eighth Embodiment

Figure 25:
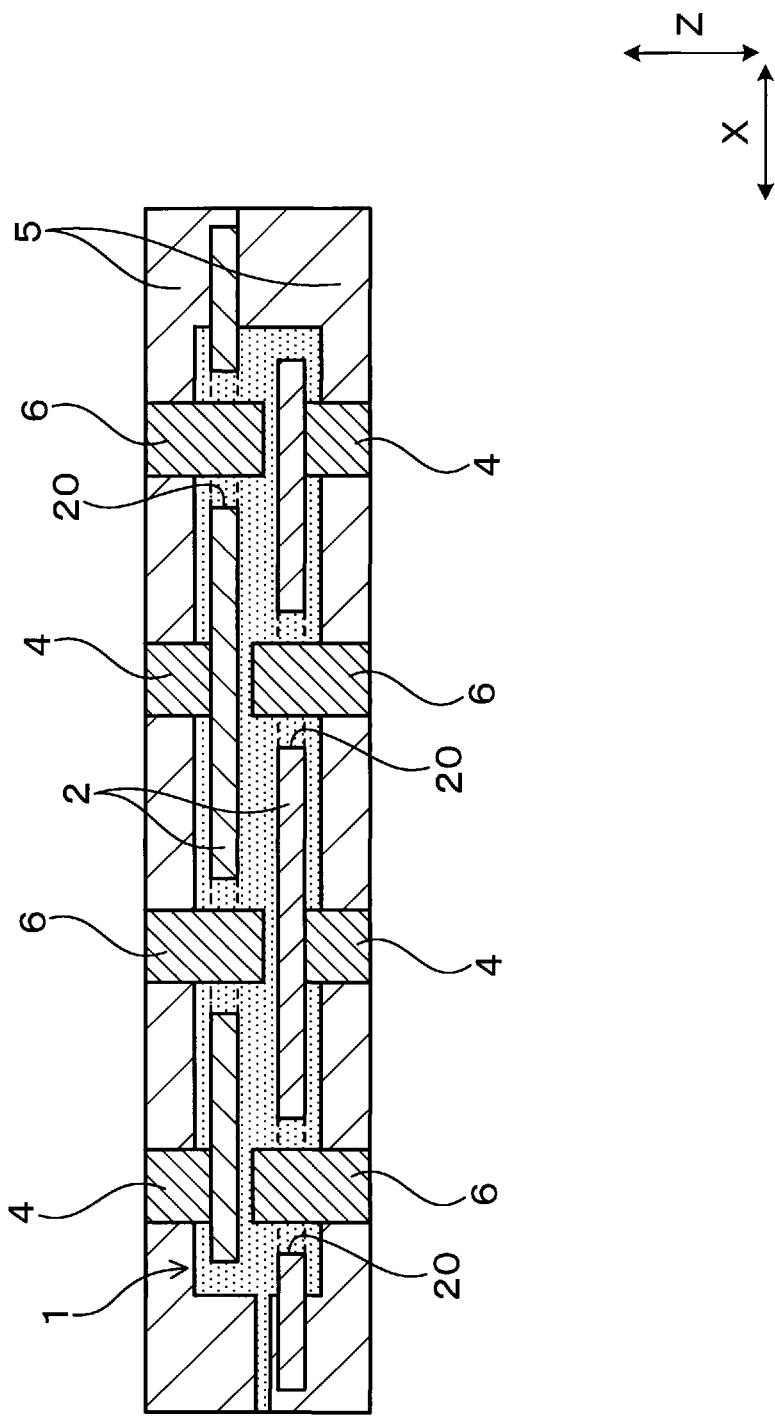
FIG. 25 is an explanatory view of a manufacturing method of a conductive member module in an eighth embodiment.

The present embodiment is an example in which the rigidity of the conductive members 2 is increased. As shown in FIG. 25, the conductive members 2 of the present embodiment have higher rigidity than that of the first embodiment; thus, even when the sealing step is performed, the conductive members 2 are hardly deformed due to the force F of the resin 30.

Other than the above, the present embodiment has the same configurations, functions and effects as those of the first embodiment.

Ninth Embodiment

Figure 26:
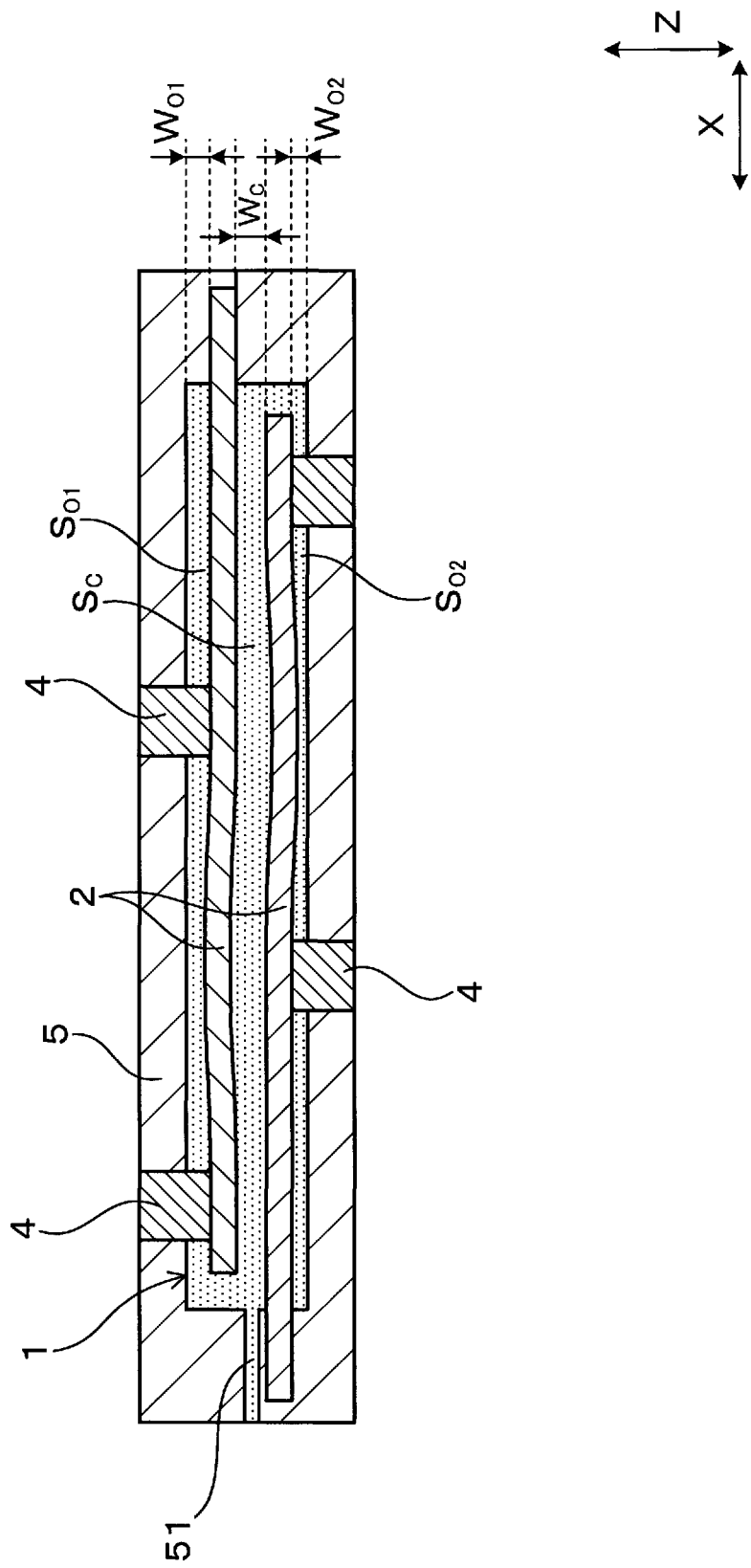
FIG. 26 is an explanatory view of a manufacturing method of a conductive member module in a ninth embodiment.

The present embodiment is an example in which the arrangement positions of the conductive members 2 are changed. In the present embodiment, as shown in FIG. 26, a central space $S_C$ and two outer spaces $S_O$ ($S_{O1}$ and $S_{O2}$) are formed in the die 5, similarly to the first embodiment. Of the two outer spaces $S_{O1}$ and $S_{O2}$, one outer space $S_{O1}$ has a longer Z-direction length $W_{O1}$ than the Z-direction length $W_{O2}$ of the other outer space $S_{O2}$. The central space $S_C$ has a larger width in the Z direction than either of the two outer spaces $S_{O1}$ and $S_{O2}$.

Other than the above, the present embodiment has the same configurations, functions and effects as those of the first embodiment.

Tenth Embodiment

Figure 27:
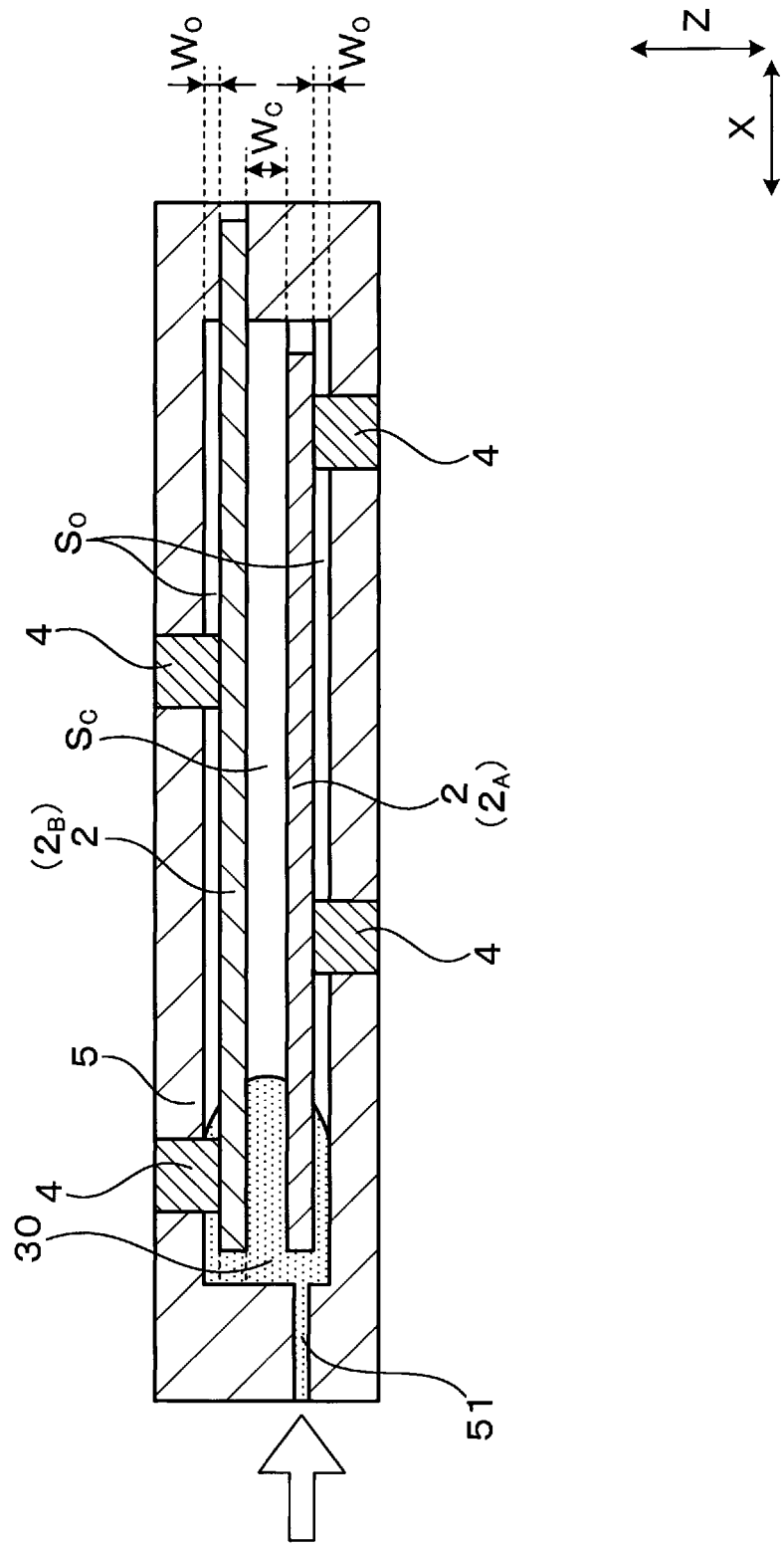
FIG. 27 is an explanatory view of a manufacturing method of a conductive member module in a tenth embodiment.

The present embodiment is an example in which the formation position of the gate 51 is changed. As shown in FIG. 27, in the present embodiment, the gate 51 is arranged in a position adjacent to one conductive member $2_A$ of a pair of conductive members 2 ($2_A$ and $2_B$). The resin 30 is injected from the gate 51 in a direction parallel to the conductive members 2. Further, in the present embodiment, the Z-direction length $W_C$ of the central space $S_C$ is longer than the Z-direction length $W_O$ of the outer spaces $S_O$, similarly to the first embodiment. Accordingly, the resin 30 is more likely to flow into the central space $S_C$ than into the outer spaces $S_O$. Therefore, the central space $S_C$ is completely filled with the resin 30 earlier than the outer spaces $S_O$. Consequently, in the sealing step, the resin 30 can generate a force F for separating the pair of conductive members 2 from each other, and the problem that the pair of conductive members 2 come into contact with each other can be suppressed from occurring.

Other than the above, the present embodiment has the same configurations, functions and effects as those of the first embodiment.

Eleventh Embodiment

Figure 28:
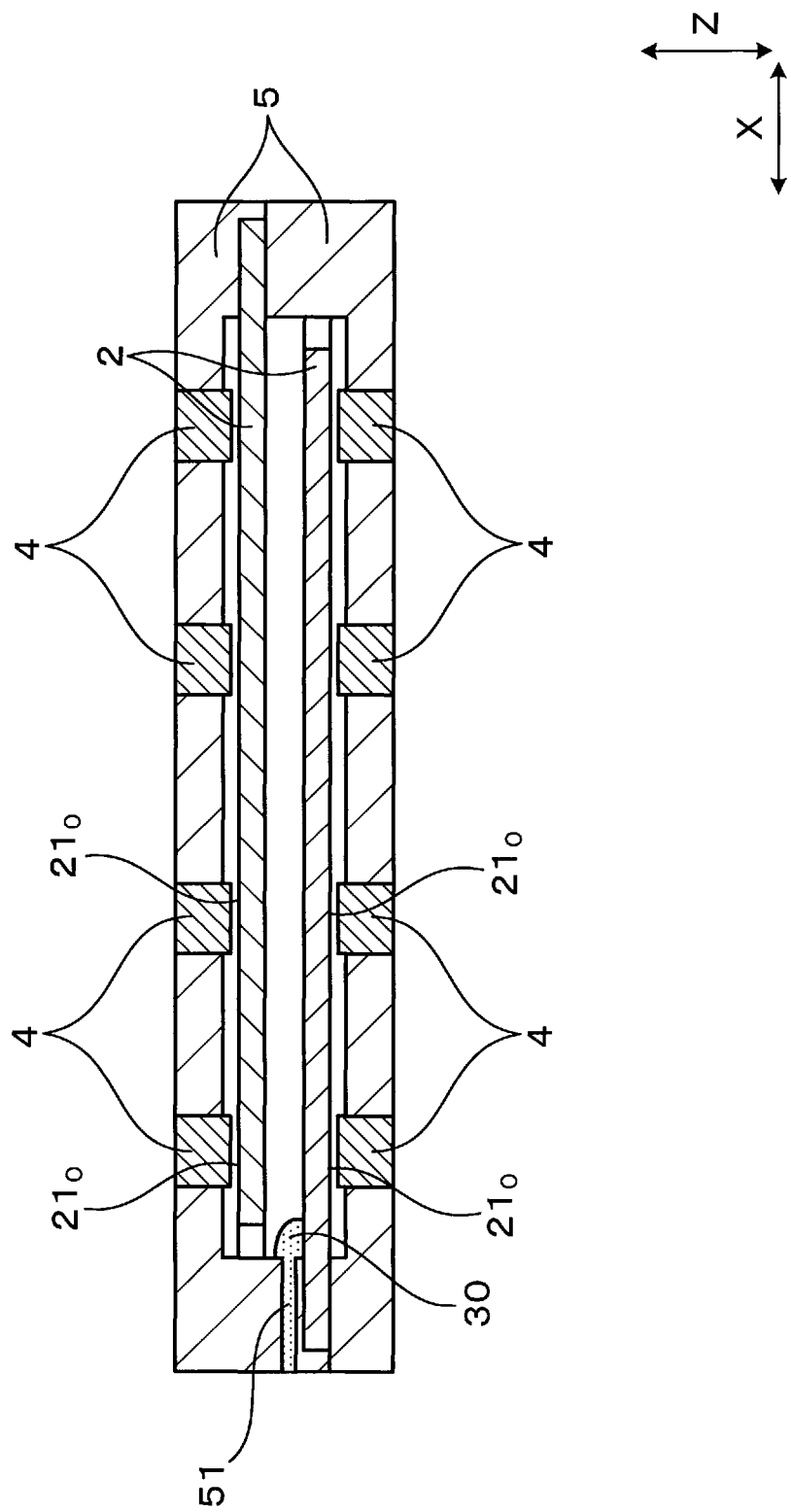
FIG. 28 is an explanatory view of a manufacturing method of a conductive member module in an eleventh embodiment.
Figure 29:
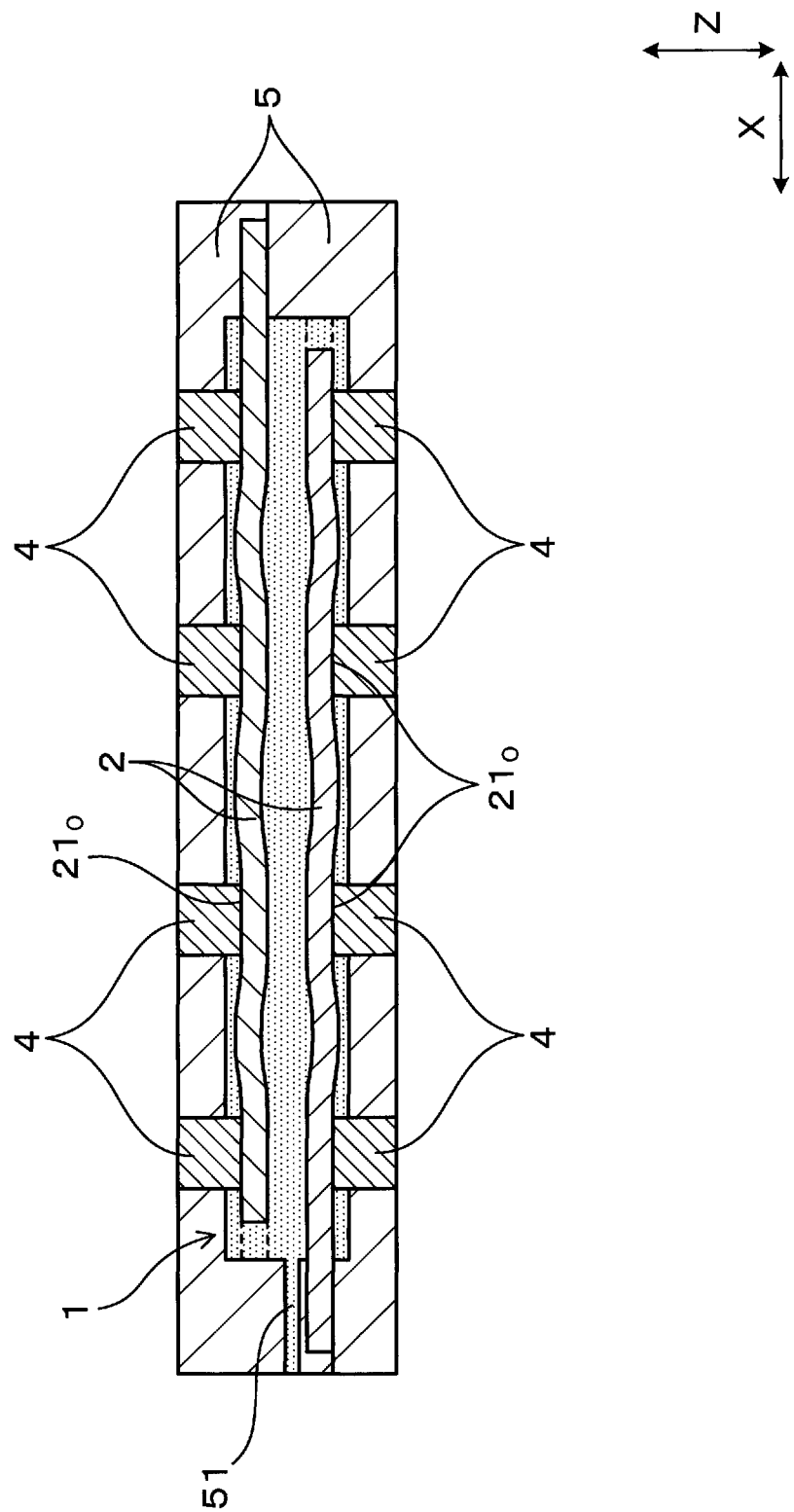
FIG. 29 is an explanatory view of the manufacturing method following FIG. 28.

The present embodiment is an example in which the positions of the tips of the support members 4 are changed. As shown in FIGS. 28 and 29, in the present embodiment, the sealing step is performed in a state in which the tips of the support members 4 are separated from the outer surfaces 210 of the conductive members 2. The individual conductive members 2 receive a force F from the resin 30 and are pressed in directions away from each other. The conductive members 2 are supported by the support members 4. As shown in FIG. 29, when the sealing step is completed, the outer surfaces $21_O$ of the conductive members 2 are in contact with the support members 4.

Other than the above, the present embodiment has the same configurations, functions and effects as those of the first embodiment.

Twelfth Embodiment

Figure 30:
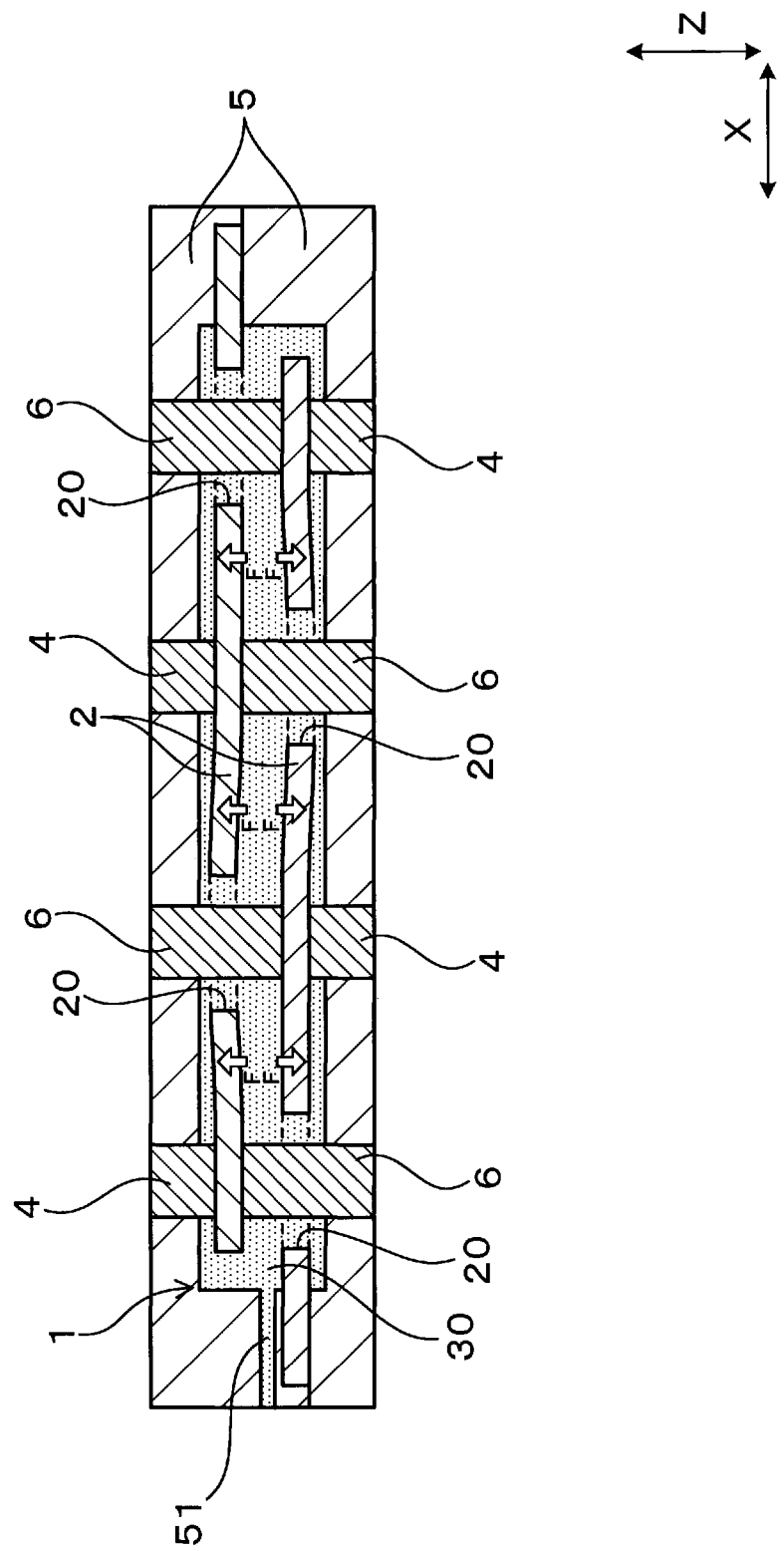
FIG. 30 is an explanatory view of a manufacturing method of a conductive member module in a twelfth embodiment.

The present embodiment is an example in which the positions of the tips of the through hole insertion pins 6 are changed. As shown in FIG. 30, in the present embodiment, the sealing step is performed in a state in which the tips of the through hole insertion pins 6 and the tips of the support members 4 are brought into contact with the conductive members 2. That is, in the present embodiment, the sealing step is performed in a state in which the individual conductive members 2 are sandwiched between the through hole insertion pins 6 and the support members 4. The individual conductive members 2 receive a force F from the resin 30 in directions away from each other. Therefore, the individual conductive members 2 are slightly curved in the manufactured conductive member module 1.

Other than the above, the present embodiment has the same configurations, functions and effects as those of the first embodiment.

Thirteenth Embodiment

Figure 31:
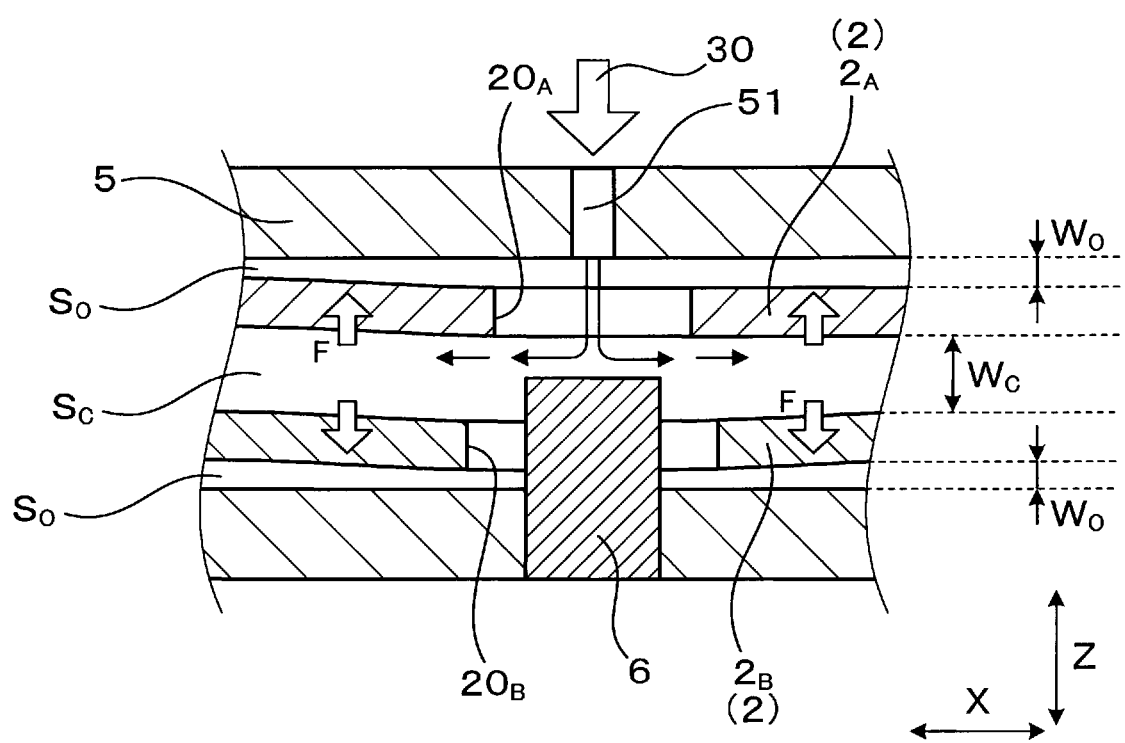
FIG. 31 is an explanatory view of a manufacturing method of a conductive member module in a thirteenth embodiment.

The present embodiment is an example in which the position of the gate 51 is changed. As shown in FIG. 31, in the present embodiment, the gate 51 is formed in a position adjacent to the conductive member 2 in the Z direction. Through holes $20_A$ and $20_B$ are formed in the individual conductive members $2_A$ and $2_B$, respectively. The through holes $20_A$ and $20_B$ are formed concentrically. In the present embodiment, the resin 30 is injected in the Z direction toward the through hole $20_A$ formed in one conductive member $2_A$ of the pair of conductive members $2_A$ and $2_B$. The through hole insertion pin 6 is inserted into the through hole $20_B$ of the other conductive member $2_B$. The injected resin 30 abuts the tip of the through hole insertion pin 6, changes its direction, and flows into the central space $S_C$.

Moreover, in the present embodiment, the Z-direction length $W_C$ of the central space $S_C$ is longer than the Z-direction length $W_O$ of the outer spaces $S_O$, similarly to the first embodiment. Accordingly, the resin 30 is more likely to flow into the central space $S_C$ than into the outer spaces $S_O$. Therefore, the central space $S_C$ is completely filled with the resin 30 earlier than the outer spaces $S_O$. Consequently, the resin 30 generates a force F for pressing the individual conductive members 2 outward, and the problem that the conductive members 2 come into contact with each other can be suppressed from occurring.

Other than the above, the present embodiment has the same configurations, functions and effects as those of the first embodiment.

The present disclosure is described according to embodiments; however, it is understood that the present disclosure is not limited to the embodiments and configurations. The present disclosure also includes various modified examples and modifications within an equivalent range. In addition, various combinations and configurations, and other combinations and configurations including more, less, or only a single element, are also within the categories and scope of the present disclosure.

What is claimed is:

1. A manufacturing method of a conductive member module having a pair of conductive members formed in long plate shape and facing each other, and a sealing part for sealing the pair of conductive members,
   the conductive members include connection terminals at both ends in a longitudinal direction, and
   the connection terminals at both ends of the conductive members are formed at positions opposite to each other across a center in a lateral direction perpendicular to both the longitudinal direction and a thickness direction, the method comprising:
   an accommodation step of accommodating the pair of conductive members in a molding die in a state of being separated from each other while sandwiching the connection terminals of the conductive members between the molding die in the thickness direction;
   a sealing step of injecting a fluid resin into the molding die to seal the pair of conductive members; and
   an extraction step of extracting the conductive member module from the molding die; wherein
   in the sealing step, the conductive members are sealed while the individual conductive members, to which a force is applied by the fluid resin injected into the molding die in directions away from each other, are supported by support members externally,
   the plurality of support members are arranged to support a plurality of locations in the longitudinal direction of the conductive members and a plurality of locations in the lateral direction of the conductive members, respectively, at positions other than the connecting terminals, and
   in the sealing step, a central space formed between the pair of conductive members is completely filled with the fluid resin earlier then outer spaces formed between the individual conductive members and the molding die in a facing direction.

2. The manufacturing method of a conductive member module according to claim 1, wherein
   the central space has a larger width in the facing direction than that of each of the outer spaces.

3. The manufacturing method of a conductive member module according to claim 1, wherein
   the support members are formed separately from the molding die.

4. The manufacturing method of a conductive member module according to claim 1, wherein
   the individual conductive members are provided with through holes penetrating in the facing direction, and in the sealing step, the fluid resin flows into the through holes.

5. The manufacturing method of a conductive member module according to claim 4, wherein
   in the sealing step, the pair of conductive members are sealed while through hole insertion pins are inserted into the through holes.

6. The manufacturing method of a conductive member module according to claim 5, wherein
   in the sealing step, the pair of conductive members are sealed while tips of the through hole insertion pins are separated from inner surfaces of the conductive members in the facing direction.

7. A conductive member module comprising:
   a pair of conductive members formed in a plate shape and facing each other,
   a sealing part made of a resin and sealing the pair of conductive members,
   through holes formed in the individual conductive members and penetrating in a facing direction of the pair of conductive members,
   first recesses formed in a recessed shape in the sealing part and having bottoms in which outer surfaces of the conductive members in the facing direction are exposed, and
   second recesses formed so as to be recessed in the facing direction through the through holes from the outside to the inside of the pair of conductive members; wherein
   the resin constituting the sealing part is partially present between inner surfaces of the conductive members and bottom surfaces of the second recesses in the facing direction.

8. A manufacturing method of a conductive member module having a pair of conductive members formed in a long plate shape and facing each other, and a sealing part for sealing the pair of conductive members,
   the conductive members include connection terminals at both ends in a longitudinal direction, and
   the connection terminals at both ends of the conductive members are formed at positions opposite to each other across a center in a lateral direction perpendicular to both the longitudinal direction and a thickness direction, the method comprising:
an accommodation step of accommodating the pair of conductive members in a molding die in a state of being separated from each other while sandwiching the connection terminals of the conductive members between the molding die in the thickness direction;
a sealing step of injecting a fluid resin into the molding die to seal the pair of conductive members; and
an extraction step of extracting the conductive member module from the molding die; wherein
in the sealing step, the conductive members are sealed while the individual conductive members, to which a force is applied by the fluid resin injected into the molding die in directions away from each other, are supported by support members externally,
the plurality of support members are arranged to support a plurality of locations in the longitudinal direction of the conductive members and a plurality of locations in the lateral direction of the conductive members, respectively, at positions other than the connecting terminals,
the individual conductive members are provided with through holes penetrating in a facing direction, and in the sealing step, the fluid resin flows into the through holes,
in the sealing step, the pair of conductive members are sealed while through hole insertion pins are inserted into the through holes, and
in the sealing step, the pair of conductive members are sealed while tips of the through hole insertion pins are separated from inner surfaces of the conductive members in the facing direction.

9. The manufacturing method of a conductive member module according to claim 8, wherein
the support members are formed separately from the molding die.

* * * * *